(12) United States Patent
Scott et al.

(10) Patent No.: US 11,714,114 B2
(45) Date of Patent: Aug. 1, 2023

(54) NON-INVASIVE DIAGNOSTIC SYSTEMS AND METHODS FOR USING THE SAME

(71) Applicant: Miami University, Oxford, OH (US)

(72) Inventors: Mark Scott, Oxford, OH (US); Matt Boubin, Queens, NY (US)

(73) Assignee: Miami University, Oxford, OH (US)

( * ) Notice: Subject to any disclaimer, the term of this patent is extended or adjusted under 35 U.S.C. 154(b) by 388 days.

(21) Appl. No.: 16/879,734

(22) Filed: May 20, 2020

(65) Prior Publication Data

US 2020/0371148 A1 Nov. 26, 2020

Related U.S. Application Data

(60) Provisional application No. 62/850,203, filed on May 20, 2019.

(51) Int. Cl.
*G01R 31/00* (2006.01)
*G06N 20/00* (2019.01)
*G01R 29/08* (2006.01)

(52) U.S. Cl.
CPC ....... *G01R 31/001* (2013.01); *G01R 29/0814* (2013.01); *G06N 20/00* (2019.01)

(58) Field of Classification Search
CPC .............. G01R 31/001; G01R 29/0814; G01R 31/002; G01R 31/281; G06N 20/00; G06N 3/126; G06N 20/10
USPC ..................................................... 324/750.27
See application file for complete search history.

(56) References Cited

U.S. PATENT DOCUMENTS

| | | | | | |
|---|---|---|---|---|---|
| 5,682,317 | A | * | 10/1997 | Keeler | G05B 23/027 701/99 |
| 5,966,312 | A | * | 10/1999 | Chen | H01L 22/20 257/E21.525 |
| 6,240,343 | B1 | * | 5/2001 | Sarangapani | G01M 15/05 73/114.61 |
| 6,442,511 | B1 | * | 8/2002 | Sarangapani | G06F 11/008 702/194 |
| 6,823,675 | B2 | * | 11/2004 | Brunell | G05B 23/0291 60/773 |
| 2006/0230313 | A1 | * | 10/2006 | Grichnik | G05B 23/0254 714/26 |
| 2009/0306920 | A1 | * | 12/2009 | Zwinger | G01R 31/2884 324/750.01 |
| 2014/0333286 | A1 | * | 11/2014 | Wang | G01R 15/142 324/113 |
| 2019/0331729 | A1 | * | 10/2019 | Degrenne | G01B 11/16 |

* cited by examiner

*Primary Examiner* — Christopher P McAndrew
(74) *Attorney, Agent, or Firm* — Calfee, Halter & Griswold LLP

(57) ABSTRACT

A method of measuring electromagnetic interference (EMI) to noninvasively identify component degradation or failure in power electronics circuitry. The method involves characterizing the degradation or failure characteristics of the component and modeling those characteristics to enable a machine learning algorithm to identify EMI frequency distribution characteristics that correspond to the degradation or failure. The EMI frequency distribution is measured and the data provided to the machine learning algorithm whereupon the algorithm identifies degradation or failures indicated by the measured data.

20 Claims, 37 Drawing Sheets

Schematic of a three phase inverter used in simulation.

Equivalent circuit of DM noise propagation paths in a three phase inverter.

Block Diagram used to describe data collection methods.

EMI spectrum of the new and aged capacitor classes (a) and the features that were extracted from the point of greatest difference (b).

EMI spectrum of the CM (a) and DM (b) EMI response in new and aged capacitor classes.

NON-INVASIVE DIAGNOSTIC SYSTEMS AND METHODS FOR USING THE SAME

CROSS-REFERENCE TO RELATED APPLICATION

This application claims the benefit of U.S. Provisional Application No. 62/850,203, filed May 20, 2019, the entire disclosure of which is hereby incorporated herein by reference.

TECHNICAL FIELD

The general inventive concepts relate generally to power electronics, and more specifically, to systems and methods for detecting component degradation in power electronics circuitry.

BACKGROUND

Power electronics convert electrical energy from one form and magnitude to another form and magnitude. One example of power electronics is an inverter, which converts direct current (DC) into alternating current (AC). These devices are used in many different applications, an example of which is motor drives used in electric vehicles, elevators, and process controls. Another example is uninterruptable power supplies used to provide continuous power to critical systems. A third example is power conversion for solar panels. In each of these example systems, failure of the inverter could result in injury or loss. Inverters are comprised of control circuitry, power semiconductors, and various passive components such as capacitors and inductors. Failure of any of these components could result in a disturbance to the AC output provided by the inverter.

The inventors have realized that, in light of the critical nature of many systems that utilize power electronic components, there is an unmet need for a system for and/or method of detecting the degradation of the power electronic components.

SUMMARY

In one exemplary embodiment, electromagnetic interference (EMI) produced by a three-phase inverter is monitored and a machine learning algorithm is applied to detect EMI characteristics that indicate component degradation or failure.

In another exemplary embodiment, failure modes due to aging, abuse, or defects are modeled in order to permit an EMI characteristic indicative of each of these failure modes to be identified. The identified characteristics are then provided to a machine learning algorithm to teach a monitoring controller to recognize the EMI characteristics that indicate component failures.

In a further exemplary embodiment, measurement capabilities are added to an EMI filter for use in diagnostics systems. This approach provides a low-cost, high-bandwidth method to perform in-situ measurements.

In another exemplary embodiment, genetic algorithms may be used in a 'virtual twin' of power electronics to detect component age or failure. The virtual twin can also determine if the power electronics has been compromised by a malicious attack. It should be appreciated that in this embodiment, the virtual twin of a component may be modeled, along with failure modes of the virtual twin (e.g., a failure mode by malicious attack) for training the machine learning algorithm.

These and other objects, features and advantages of the general inventive concepts will become better understood with regard to the following description and accompanying drawings in which:

BRIEF DESCRIPTION OF THE DRAWINGS

These and other features of the general inventive concept will become better understood with regard to the following description and accompanying drawings in which.

DETAILED DESCRIPTION

The general inventive concepts will be understood more fully from the detailed description given below and from the accompanying drawings of the various aspects and implementations of the disclosure. This should not be taken to limit the general inventive concepts to the specific aspects or implementations, which are being provided for explanation and understanding only.

Electromagnetic Interference (EMI) is generally considered an undesirable result of the operation of electrical and electronic circuitry. Because of the undesirable nature of EMI, much research focuses on developing techniques to reduce or eliminate it. EMI is particularly distracting in many sensing applications where it can distort or otherwise completely overshadow a signal being measured. As understood by one of ordinary skill in the art, EMI is composed of a range of frequencies whose amplitude and phase vary according the source of the EMI and its coupling network to the receiver.

These frequencies can be measured using a frequency spectrum analyzer, or other measurement device, which can be configured to generate a graph of the measured EMI amplitude (and/or phase) vs. frequency. However, there are circumstances in which EMI could be used to detect changes or potential problems in an electronic device. For example, an electric component in an electric vehicle (EV) that plays a critical role (e.g., battery charging). Detecting degradation in such a circuit could greatly improve the safety and reliability of the EV. A non-invasive detection system that could be configured to continuously monitor the component would be particularly advantageous. The inventors have developed systems and method for using EMI to perform continuous and non-invasive monitoring.

As will be described herein, an exemplary embodiment utilizes machine learning and/or digital signal processing techniques to analyze the conducted EMI generated by a three-phase inverter.

Figure 1:
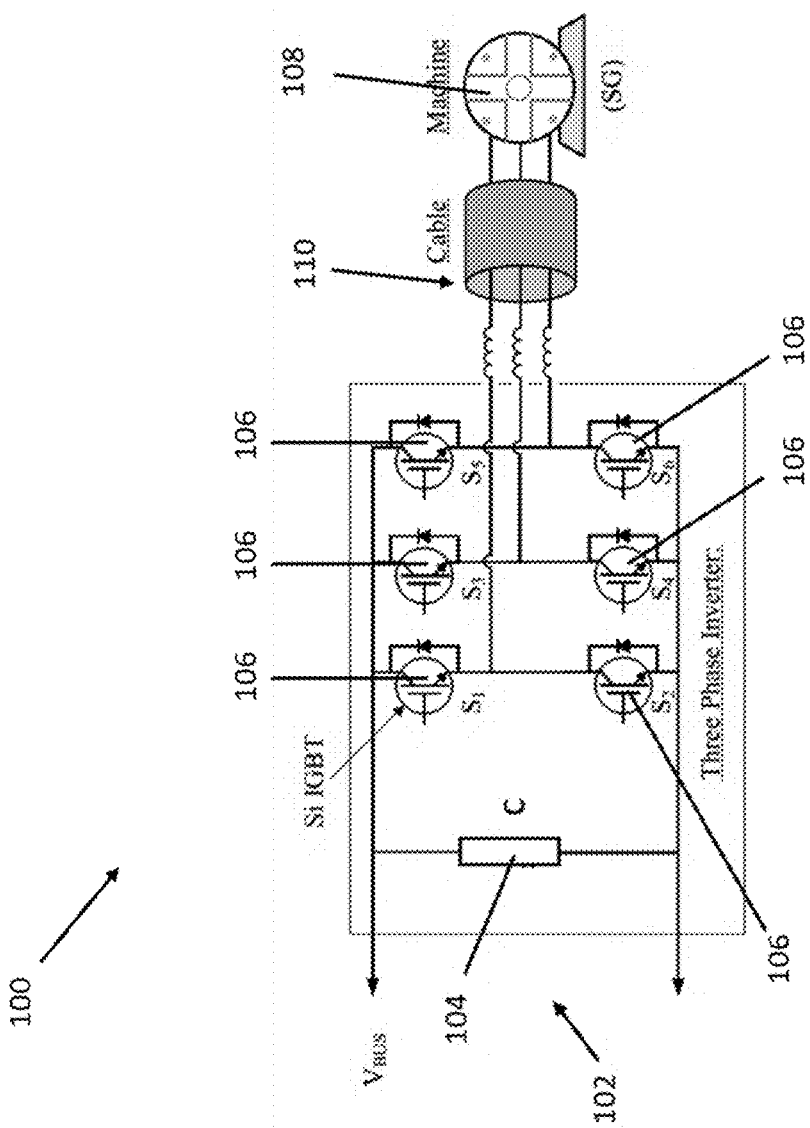
FIG. 1 illustrates an exemplary embodiment of a three-phase inverter and load of an electric vehicle, in accordance with the general inventive concepts.

Referring now to the drawings, which are for purposes of illustrating exemplary embodiments of the subject matter herein only, and not for limiting the same, FIG. 1 shows an electrical schematic of a power section of an exemplary three-phase inverter 100 and DC input 102.

Depending upon the application, this input is in electrical communication with a DC power source such as a battery, generator, solar array, power electronics, etc. For exemplary purposes only, and not for limiting the general inventive concepts, to better explain the general inventive concepts, an exemplary embodiment involving a three-phase motor drive for an electric vehicle is referenced herein and used. In an electric vehicle (EV) or a hybrid electric vehicle, an electric motor is used to provide motive power to the vehicle. One of ordinary skill in the art will appreciate that embodiments of the general inventive concept can also be applied to other electronic devices.

A DC link capacitor 104 may be a component that is connected in parallel with the DC power source. The DC link capacitor 104 is used to smooth the current drawn from the DC source. Film capacitors are the most commonly used type of DC link capacitor in EV inverters. Because of its parallel connection to a vehicle battery bank, a DC link capacitor failure in an EV inverter would be extremely dangerous. Even though much research has gone into creating more resilient capacitors, DC link capacitors used in EVs are at risk of being exposed to high temperatures, changes in humidity, and other external factors that could cause them to degrade or fail more easily than in some other power electronics applications.

Film capacitors are superior to electrolytic capacitors because they are able handle higher currents while having a lower capacitance than other types of capacitors. Additionally, because film capacitors are designed to operate well in higher voltage applications, they are usually the best choice for a DC link capacitor 104. It should be appreciated that embodiments of the general inventive concept described herein may be applicable to other capacitors as well (e.g., electrolytic capacitors which may be found in solar panel inverters.

Also illustrated in FIG. 1 are six Insulated Gate Bipolar Transistors (IGBTs) 106 that form the inverter bridge which converts DC voltage from the DC power source to AC voltage. Depending upon the application, this AC voltage is provided to a motor 108 through cabling 110 or a conductive bus. Not shown are cooling components such as heatsinks that are used to dissipate heat from the IGBTs caused by conduction and switching losses. As can be observed in this simplified diagram 100, an exemplary inverter includes a plurality of different components. It should be appreciated that this description will: focus on the age-related failures of the DC link capacitor 104 and mechanical failure exemplified by a loss of a ground bond to a heatsink, and also, contains information about using monitor semiconductor health. However, the method is applicable to the IGBTs 106, the motor 108, and/or the cabling 110. One of ordinary skill in the art will appreciate that the general inventive concepts described herein may also be applied to semiconductor power devices other than IGBTs 106.

Figure 2:
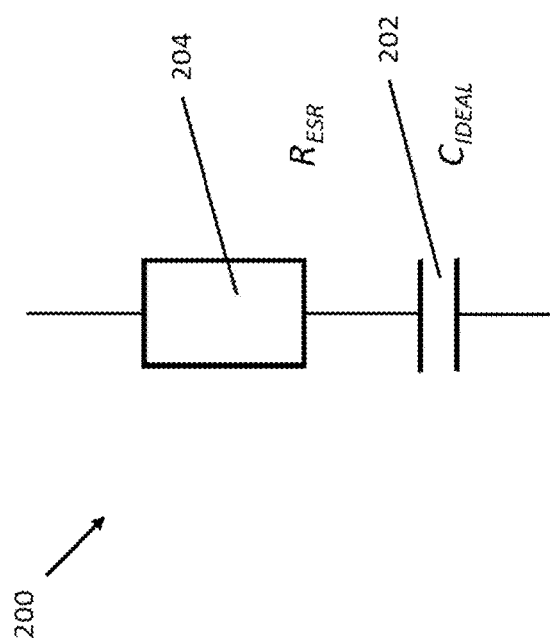
FIG. 2 is an exemplary schematic model of a capacitor as might be used in FIG. 1, in accordance with the general inventive concepts.

FIG. 2 illustrates a simplified model of a first order model capacitor 200 showing an equivalent series resistance ($R_{ESR}$) and capacitance ($C_{IDEAL}$). As shown, the capacitor can be modeled as having a capacitance ($C_{IDEAL}$) value (C) 202 and an equivalent series resistance ($R_{ESR}$) 204. Due to the environmental and electrical conditions that an EV inverter is subjected to during operation, the change in a DC link capacitor's behavior as it ages can be significant enough to affect the performance of the inverter system.

Figure 3:
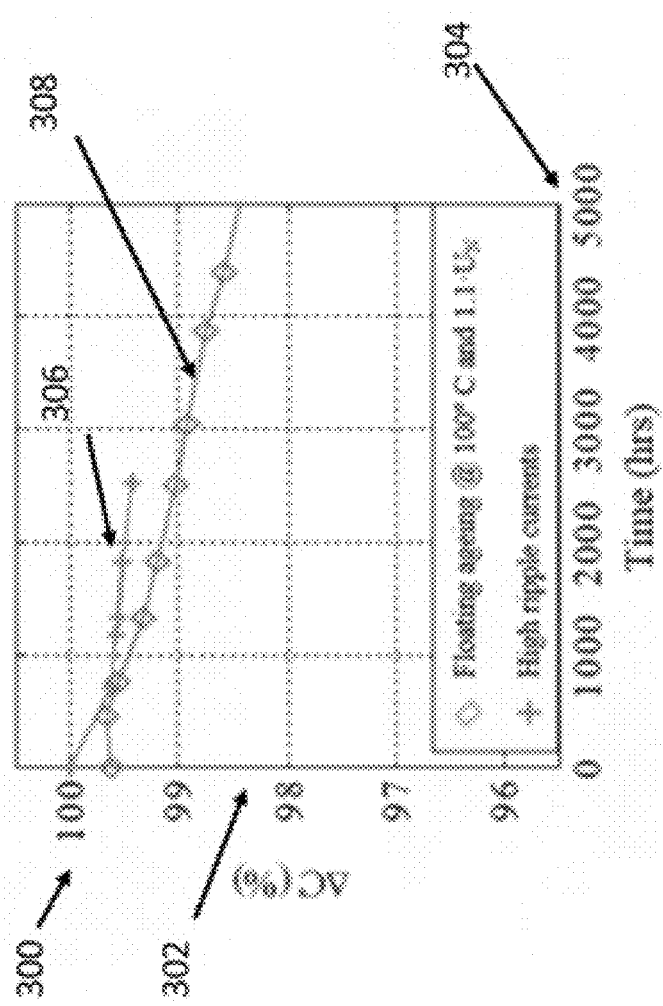
FIG. 3 represent changes to capacitance as an exemplary capacitor ages, in accordance with the general inventive concepts.

FIG. 3 illustrates a graph 300 of the capacitance change 302 over time 304 caused by high levels of ripple current 306 and also aging when voltage is applied and the capacitor is subject to a high ambient temperature 308. As shown in the exemplary embodiment of FIG. 3, the model of the capacitor's capacitance (C) decreases due to aging. Two different types of aging tests may be applied (e.g., an aging test based on component operation (i.e., component use) and an aging test based on the component idling). As shown in this exemplary embodiment, the first waveform (orange) is aging that occurs to both elevated temperatures and overvoltage on the DC bus. The second waveform (green) is due to high ripple current moving within the device.

Figure 4:
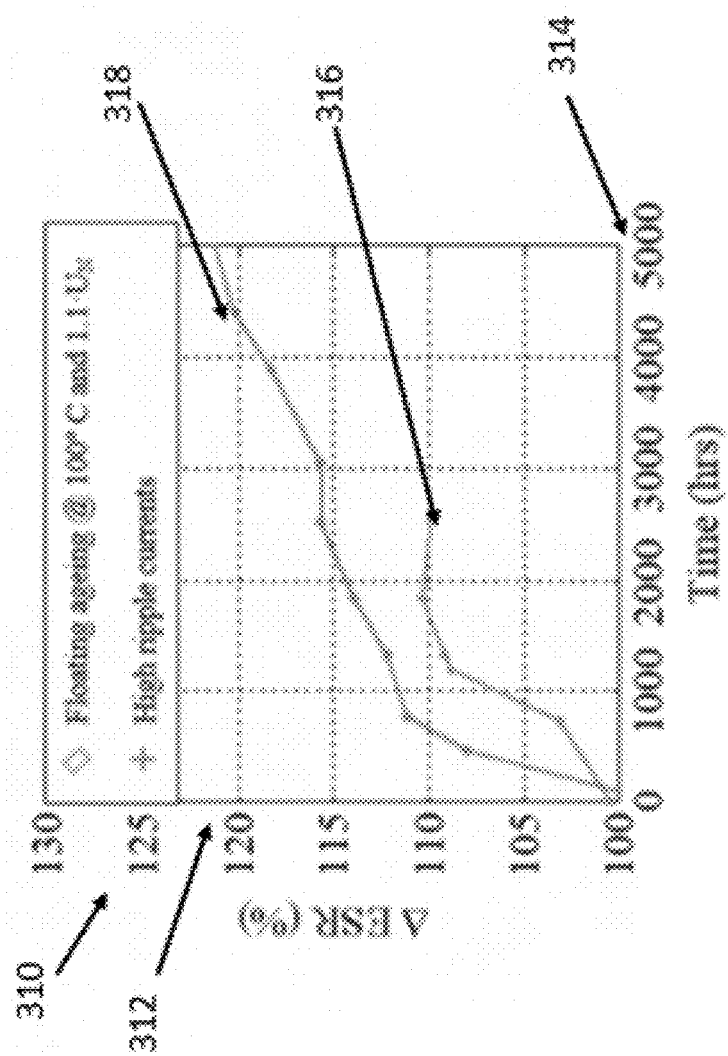
FIG. 4 represent changes to series resistance as an exemplary capacitor ages, in accordance with the general inventive concepts.

FIG. 4 illustrates a second graph 310 which illustrates the change in $R_{ESR}$ 312 over time 314 caused by high levels of ripple current 316 and also aging when voltage is applied and the capacitor is subject to a high ambient temperature 318. As shown in the exemplary embodiment of FIG. 4, the model of a capacitor's equivalent series resistance (ESR) increasing due to aging. Two different types of tests may be applied and may be similar to the test applied in FIG. 3. The first waveform (orange) is aging that occurs to both elevated temperatures and overvoltage on the DC bus. The second waveform (green) is due to high ripple current moving within the device. It should be appreciated that the embodiment of FIG. 4 shows a combination of the behaviors displayed in FIG. 3 to, for example, identify failure type(s).

Aging characteristic data such as presented in FIG. 3 and FIG. 4 is used by an exemplary embodiment in a machine learning process. An example of such a process is Support Vector Machine (SVM) learning. SVM is a regression-based supervised learning model that is used to organize data sets into a finite number of classes. Before SVM can classify data sets, a training model that describes data sets from each class must be developed. A training model is created by compiling data sets with known classes together to generate support vectors that support a given class. In training, the SVM maps data sets, $x_i$, to a higher order dimensional space by using a kernel function. Using a training model, the SVM classifies unsupervised datasets submitted in the same format as the data sets used to train the SVM. In an exemplary embodiment, a model with two possible classes is created, although many more classes (e.g., five classes as will be discussed herein) may be used in some embodiments. A training model used may be generated using a radial basis function (RBF) kernel (EQ 1).

$$K(x, xi) = \exp\left(\frac{-\gamma \|x - x_i\|^2}{\sigma}\right) \quad \text{EQ 1}$$

In the kernel function, x is the value describing the class, $x_i$ is a data set of length i, σ is the standard deviation of $x_i$, and γ is a scaling parameter, which was chosen to be 0.5.

Data sets that are used for testing are compared to the training model, and the SVM classifies data sets into one of the defined classes. In the exemplary process, the correct class of the test data sets are known to the user, and the accuracy of the SVM classification function can be determined. The classification function used by the SVM is described by EQ 2 where $a_i$ is the data scaling factor, $y_i$ is a data set of length i used for testing, and b is the error offset constant.

$$f(x) = \sum_{i=0}^{N} a_i y_i K(x, x_i) + b \quad \text{EQ 2}$$

In an exemplary embodiment, training data was generated using a circuit simulator (for example, LTSpice). A circuit similar to what is illustrated in FIG. 1 is modeled in the circuit simulator and $C_{Ideal}$ and $R_{ESR}$ are varied in the model to simulate the aging of the capacitors. Two classes of capacitor states, "new" and "old" capacitors, are generated for the inverter. The time range for the old capacitor state class is selected using known methods of determining the lifetime of film capacitors. This method is used to generate $C_{Ideal}$ and $R_{ESR}$ for the number of hours aged, given in the columns of Table I and Table II. Table I lists the combinations of values used to create the training sets that describe "new" capacitor classes. In Table II, the combinations of $C_{Ideal}$ and $R_{ESR}$ that is used in the "old" capacitor class are given.

TABLE I $C_{IDEAL}$ AND $R_{ESR}$ VALUES FOR TRAINING SETS THAT DESCRIBE THE NEW CAPACITOR CLASS.

| Age (hours) | 0 | 2 | 4 | 6 |
|---|---|---|---|---|
| $C_{Ideal}$ (F) | 0.0002 | 0.0002 | 0.0002 | 0.0002 |
| $R_{ESR}$ (Ω) | 0.04 | 0.04 | 0.04 | 0.04 |

TABLE II $C_{IDEAL}$ AND $R_{ESR}$ VALUES FOR TRAINING SETS THAT DESCRIBE THE OLD CAPACITOR CLASS.

| Age (hours) | 500 | 750 | 1000 | 1250 |
|---|---|---|---|---|
| $C_{Ideal}$ (F) | 0.0002 | 0.0002 | 0.0002 | 0.0002 |
| $R_{ESR}$ (Ω) | 0.0428 | 0.0444 | 0.0448 | 0.045 |

In an exemplary embodiment the SVM is trained using three of the four feature profiles from each class. The SVM classifies the remaining two features (one from each class) into either the new capacitor class or old capacitor class. This process is repeated for every permutation of the feature profiles. For example, one set of classes was created using the results from columns 0, 2, and 4 from Table I and columns 500, 750, and 1250 from Table II. The test results for 6 from Table I and 1250 from Table II are supplied to the SVM, and sorted accordingly. A second test is then performed using data from columns 0, 4, and 6 from Table I and 500, 1000, and 1250 from Table II. In an exemplary embodiment, sixteen permutations are completed. In an exemplary embodiment, this results in the features used in testing the training model to be classified in its correct class with 100% accuracy.

Exemplary embodiments may be used to detect circuit fault characteristics in addition to component aging as was described herein. For example, as will be understood by one of ordinary skill in the art, the power semiconductors such as the IGBTs 106 illustrated in FIG. 1, generate heat as the result of various inefficiencies inherent in the IGBT itself and also the application. In order to manage this heat to avoid damage to the IGBT 106, a heat sink is employed. Frequently these are aluminum but may be other materials. For reasons of safety and to control electrical interference caused by the IGBT being switched on and off at potentially high frequencies, these heat sinks are often bonded to a ground point, or equipment chassis. Other bonding connections can be used depending upon the application and circuit design. Whatever the connection, if this bond fails, a safety or performance issue can arise. An exemplary embodiment can be used to detect such a bond failure. To illustrate how this may be performed, data is collected from two separate classes of three-phase inverters in a test environment. In the first instance, the heatsink for the power semiconductors was connected to a ground plane. In the second instance, the heatsink was left unconnected. In actual use of an inverter or other device, the unconnected condition could result from a broken ground wire, which, as noted earlier, may create excessive electrical interference ("noise") issues or result in a safety concern.

In an exemplary embodiment, three tests are conducted for each class. Frequency data is collected in real-time using a spectrum analyzer connected to a line impedance stabilization network (LISN) circuit. In some embodiments, a current sensor may be utilized. EMI characteristics are extracted from each test for use in training the SVM. In order to extract behavior characteristics (features), the average of the data is taken from each class, and the difference of the averaged signals is recorded. In an exemplary embodiment, twenty features were extracted from each test at the frequencies where the EMI voltage magnitudes of each average signal had the greatest difference. These are illustrated in the voltage vs frequency graph 400 of FIG. 5. The spectral data was averaged to produce "Float-AVG" 402 and "Gnd-AVG" 404. Also included is the difference between the two averaged signals 406. The frequencies at which features were extracted is noted at 408. As observable, the extracted features cluster around the points where the two waveforms are divergent.

Figure 5:
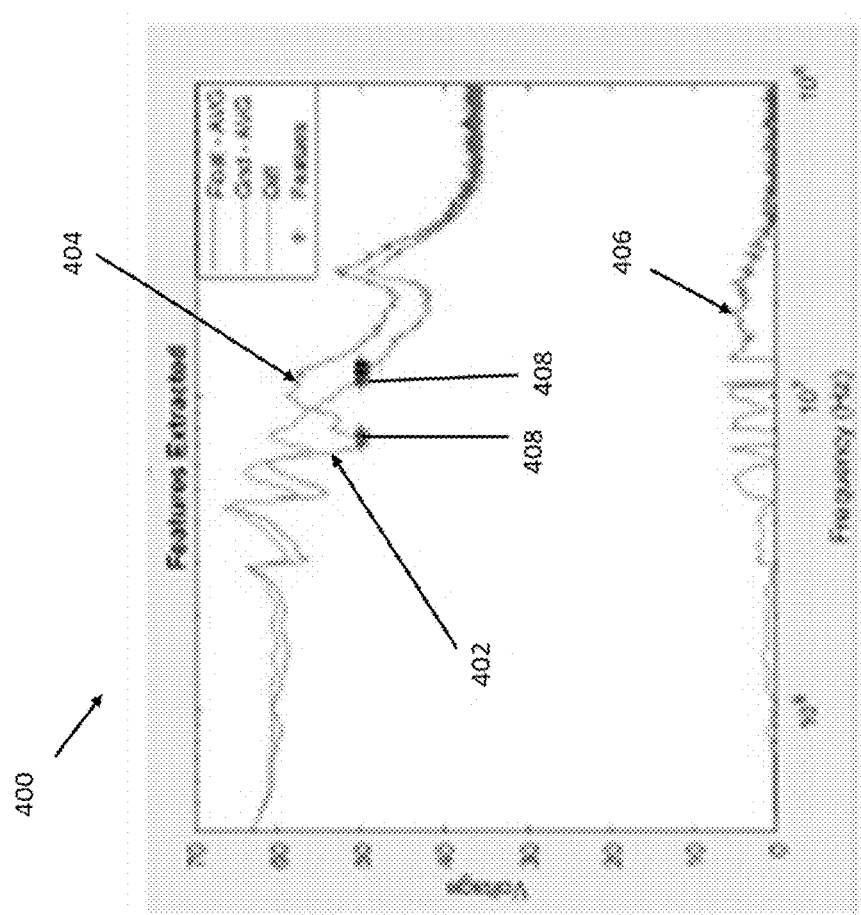
FIG. 5 illustrates an exemplary graph of waveforms detected in a test three-phase inverter, in accordance with the general inventive concepts.

In an exemplary embodiment of FIG. 5, the data may be used to train the SVM with every permutation of data sets. In some embodiments, two data sets from each class may be used to train the SVM, with at least one data set used for testing the SVM. In this manner, the SVM may be able to accurately classify each data set into the correct class.

It should be appreciated that, in this embodiment, the measured EMI may be used to identify changes in capacitor characteristics. These changes may be used to determine capacitor aging indicating pending end-of-life failure or changes in performance. In some embodiments, the measured EMI may be used to identify a fault condition that indicates potential danger or undesirable performance.

FIG. 5 further shows the difference in EMI between an inverter that is properly grounded and one that is not properly grounded. As shown, the orange waveform is grounded properly and the blue waveform has a 'broken' ground connection. The purple waveform shows the differences between the EMI spectrums. The features are the data points that are examined by the machine learning algorithm and used in the diagnostic system.

Figure 6A:
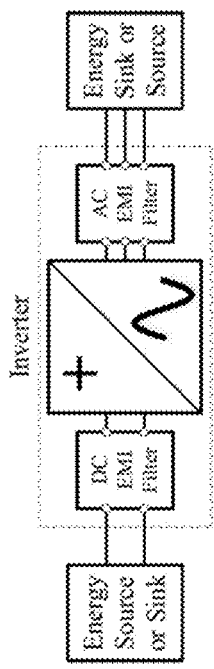
FIG. 6A illustrates a first exemplary embodiments of a power electronic, in accordance with the general inventive concepts.
Figure 6B:
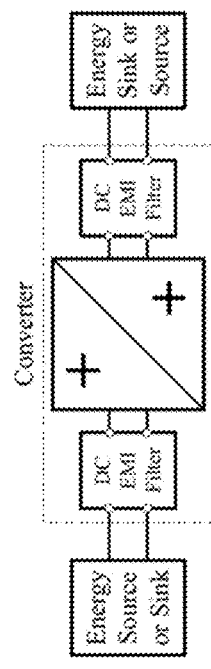
FIG. 6B illustrates a second exemplary embodiment of a power electronic, in accordance with the general inventive concepts.
Figure 6C:
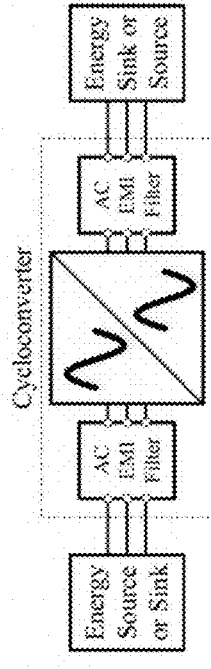
FIG. 6C illustrates a third exemplary embodiment of a power electronic, in accordance with the general inventive concepts.

With reference now to FIG. 6A, FIG. 6B, and FIG. 6C, at least three exemplary embodiments of a power electronic are shown. FIG. 6A shows one exemplary embodiment of an EMI filter installed on a DC side and/or AC side of a DC/AC inverter for inversion, passive rectification, and/or active rectification. FIG. 6B shows another exemplary embodiment of an EMI filter installed on the input and/or output of a DC/DC converter, and FIG. 6C shows a further exemplary embodiment of an EMI filter installed on the input and/or output of an AC/AC converter. It should be appreciated that one or more EMI filters may be applied at the input and/or the output of the power electronics, as desired.

Figure 7B:
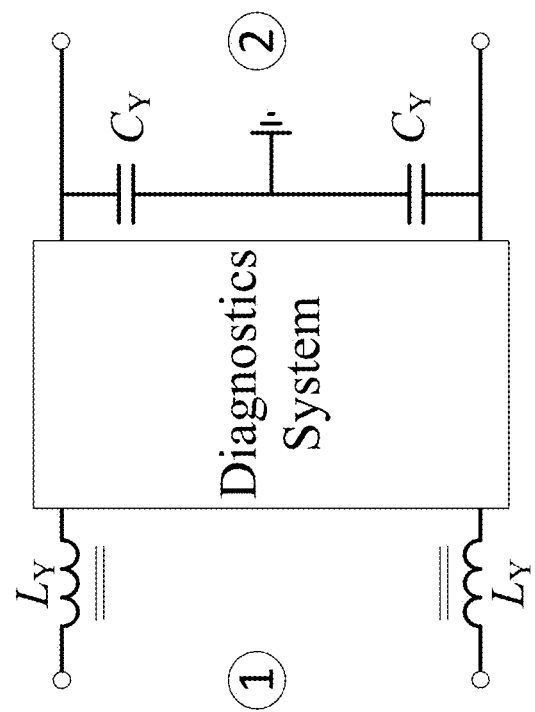
FIG. 7B illustrates an exemplary embodiment of the common-mode filter of FIG. 7A augmented with diagnostic hardware, in accordance with the general inventive concepts.
Figure 7A:
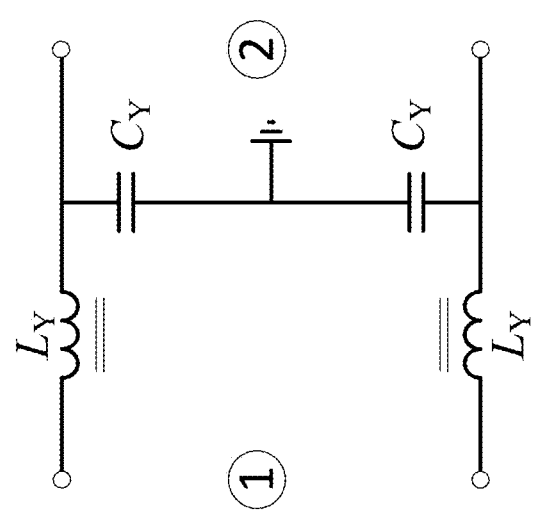
FIG. 7A illustrates an exemplary embodiment of a common-mode filter, in accordance with the general inventive concepts.

With reference now to FIG. 7A and FIG. 7B, FIG. 7A shows an exemplary embodiment of a common-mode filter for a two wire bus. In this embodiment, the common-mode filter permits DC current and low frequency AC current to move from Port 1 to Port 2 and vice-a-versa. Additionally, or alternatively, the common-mode filter may block high-frequency AC current from moving from port 1 to port 2 and vice-a-versa.

In the exemplary embodiment of FIG. 7B, the common-mode filter may be augmented with diagnostic hardware configured for detecting the health of the power electronics, its energy sources, and/or its energy sinks.

In some embodiments, the diagnostic hardware may be integrated into common-mode filters for DC systems, single-phase AC systems and/or poly-phase AC systems (i.e. Multi-wire Buses). Additionally, or alternatively, the diagnostic hardware may be integrated into differential-mode filters for DC systems, single-phase AC systems and/or poly-phase AC systems.

Figure 8:
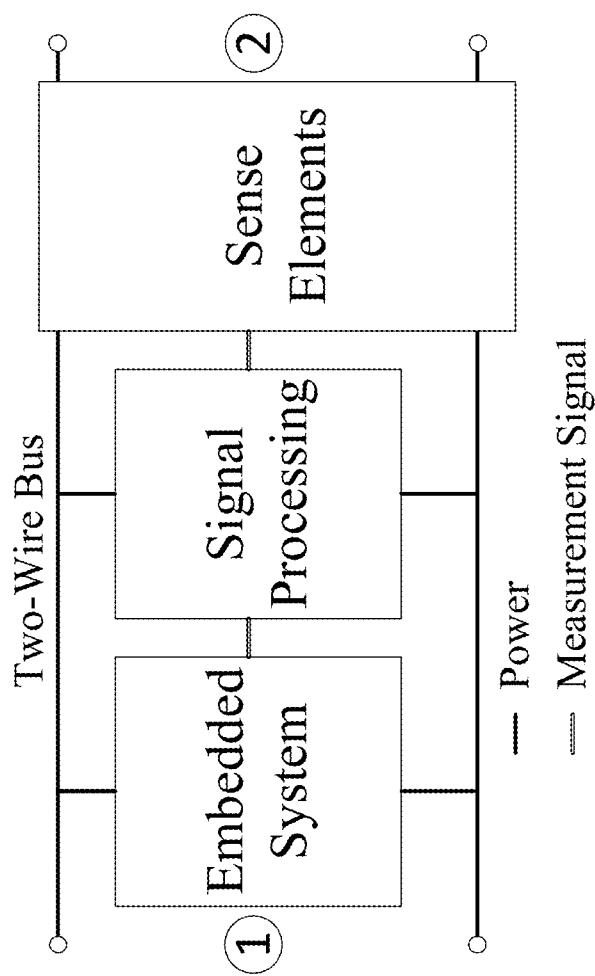
FIG. 8 illustrates a system diagram of the diagnostic hardware of FIG. 7B, in accordance with the general inventive concepts.

With continued reference to the figures, and with reference now to FIG. 8, a system diagram of the diagnostic hardware of FIG. 7B is provided. The exemplary system may be configured for a two-wire bus. At least three systems are shown, with a first system including one or more sense elements that measure the electromagnetic spectrum found on the two-wire bus; a second system, which may be a signal processing system, conditions the measurement signals for safe conversion to digital information, and a third system, which may be an embedded system, processes the digital signals and performs the diagnostic action.

It should be appreciated that energy for powering one or more of the systems may be derived from the two-wire bus and/or another energy source. Examples of other energy sources may include, a battery, an energy harvesting system, and/or an auxiliary connection.

Figure 9:
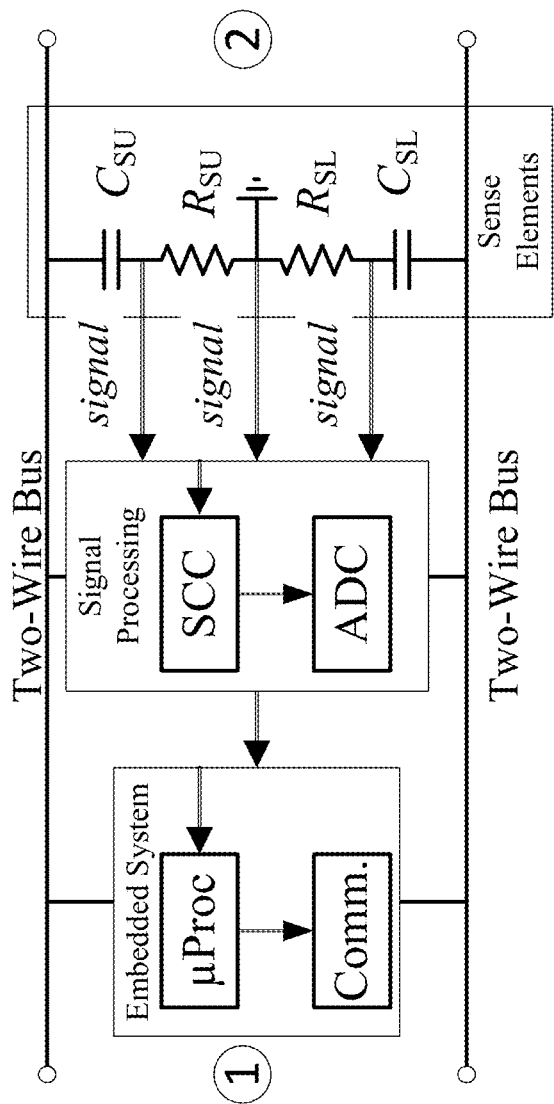
FIG. 9 illustrates an exemplary embodiment of the diagnostic hardware of FIG. 7A with sense elements, in accordance with the general inventive concepts.

With continued reference to the figures, and with reference now to FIG. 9, FIG. 9 shows a more detailed representation of the measurement hardware of FIG. 8. In this exemplary embodiment, the sense elements consist of a high pass filter formed by the elements $C_{SU}$, $R_{SU}$, $C_{SL}$, and $R_{SL}$. In some embodiments, the resistors, $R_{SU}$, and $R_{SL}$ may enable the electromagnetic spectrum to be captured by the signal processing subsystem. In some embodiments, the signal processing system may include signal conditioning circuitry (SCC) that prepares the signals for the analog to digital conversion (ADC). Additionally, or alternatively, the SCC may remove excessive noise from the signal and ensure accurate data conversion In some embodiments, the SCC may also protect the ADC from damage that may result in large disturbances on the two-wire bus.

In some embodiments, the embedded system may include a microcontroller (µProc) and/or other programmable digital device (e.g. FPGA, ASIC, GPU) that captures the signals from the ADC's output and performs diagnostic action(s). The types of action may include, but are not limited to, performing the machine learning algorithm (MLA), storing the outcome of the MLA, alerting the user to the outcome of the MLA, storing the digital signals, transmitting the digital signals to another system, or some combination thereof.

In some embodiments, µProc may be connected to an external system through communication (Comm.) hardware. This hardware may include, for example, circuitry that transmits information via wired (e.g. Ethernet, usb) and/or wireless (e.g. Wifi, Bluetooth) communications. The µProc may also store information in memory (e.g. USB drive, SD drive) for physical retrieval by a user.

Figures 10A, 10B:
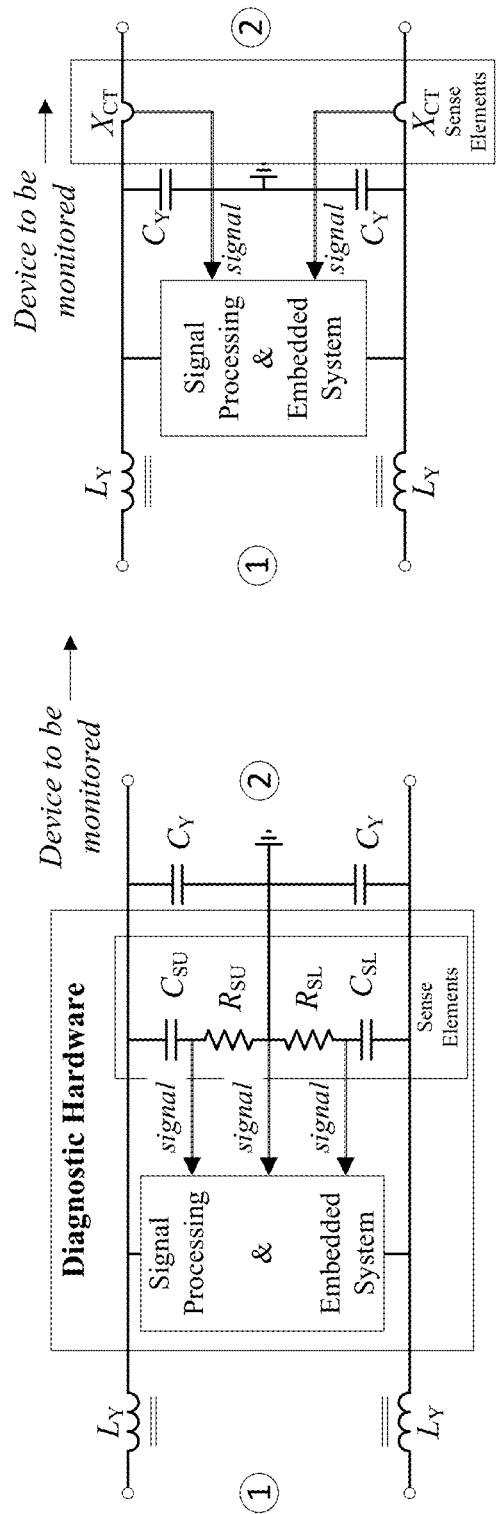
FIG. 10A illustrates an exemplary embodiment of a common-mode filter with diagnostic measurement hardware, in accordance with the general inventive concepts.
FIG. 10B illustrates an exemplary embodiment of sense elements connected in a series configuration, in accordance with the general inventive concepts.

With reference now to FIG. 10A and FIG. 10B, exemplary embodiments of the diagnostic measurement hardware (e.g., as shown in FIG. 8 and/or FIG. 9) integrated into a common-mode filter for power electronics is shown. In the embodiment of FIG. 10A, the measurement hardware may be connected in a shunt configuration via elements $C_{SU}$, $R_{SU}$, $C_{SL}$, and $R_{SL}$. FIG. 10B shows an exemplary embodiment of the sense elements connected in a series configuration via high bandwidth current sensor ($X_{CT}$) such as a current transformer or sense resistor. In some embodiments, $X_{CT}$ may be connected to the left of $C_Y$ or on both sides of $C_Y$ as the application depends.

Figure 11:
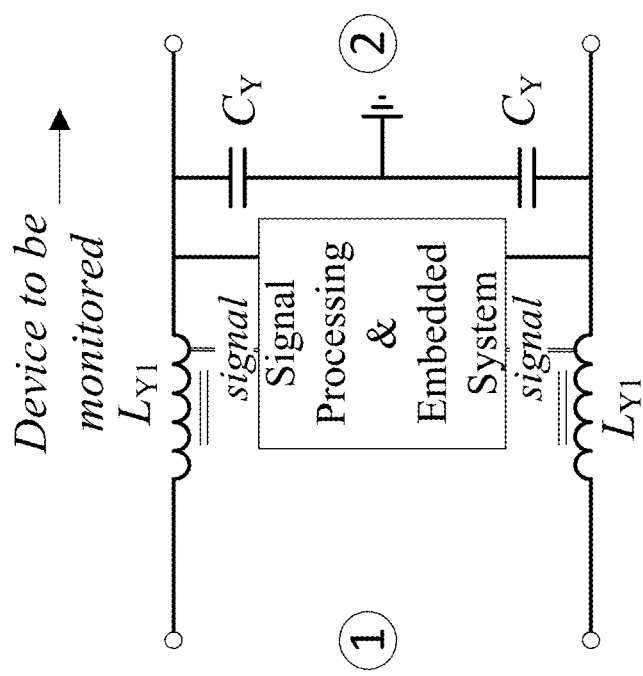
FIG. 11 illustrates an exemplary embodiment of a common-mode inductor with integrated series sense elements, in accordance with the general inventive concepts.

With continued reference to the figures, and with reference now to FIG. 11, an exemplary embodiment of the diagnostic measurement hardware that integrates series sense elements into the common-mode inductor of the common-mode filter is provided. In this embodiment, the $X_{CT}$ of FIG. 10B may be eliminated, for example, to save cost and space.

Figures 12A, 12B:
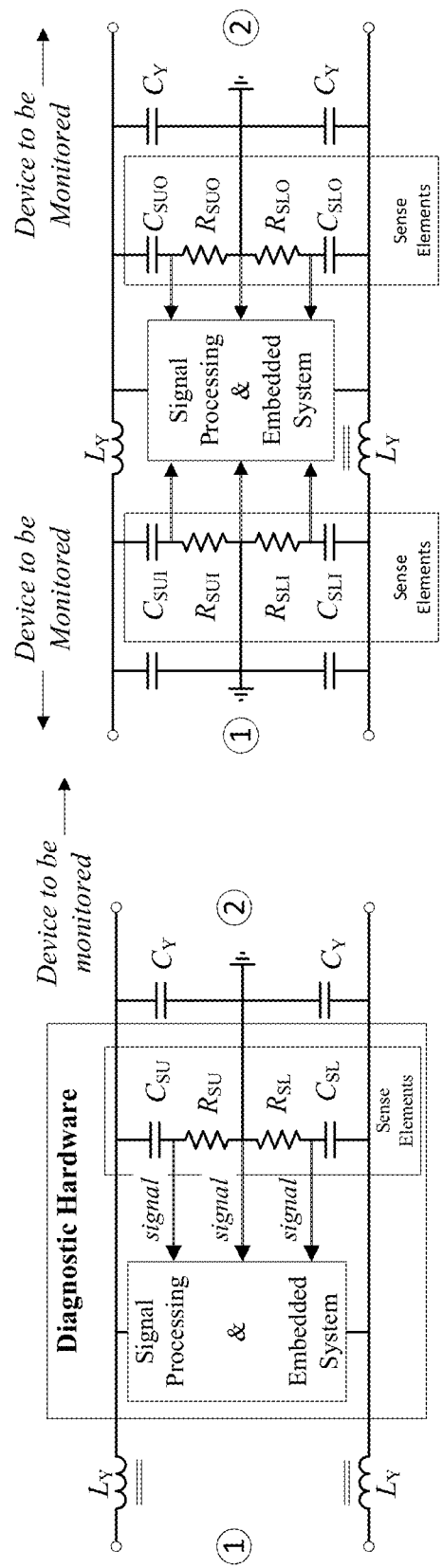
FIG. 12A illustrates an exemplary embodiment of a diagnostic hardware with a single point of measurement, in accordance with the general inventive concepts.
FIG. 12B illustrates an exemplary embodiment of a diagnostic hardware with two points of measurement, in accordance with the general inventive concepts.

With reference now to FIG. 12A and FIG. 12B, FIG. 12A shows an exemplary embodiment of the diagnostic measurement hardware with a single point of measurement. In this embodiment, for example, the diagnostic measurement hardware may monitor a single device connected to port 2. FIG. 12B shows an exemplary embodiment of the diagnostic measurement hardware with two points of measurement. In this embodiment, the diagnostic measurement hardware monitors equipment attached to both port 1 and port 2. In some embodiments, the monitor may be simultaneously. For example, it can monitor a DC source and the inverter at the same time, and/or it could monitor the inverter and/or motor plus cabling at the same time. It should be appreciated that monitoring more than two devices, depending on the design of the CM filter, may also be achieved by one or more of the general inventive concepts described herein.

Figure 13:
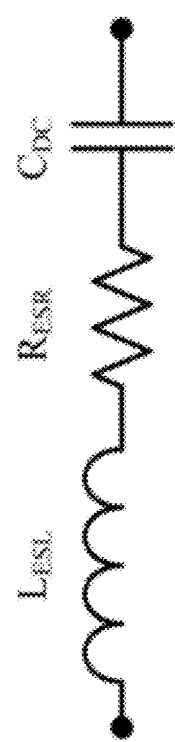
FIG. 13 illustrates an exemplary embodiment of a second-order model of a DC link capacitor, in accordance with the general inventive concepts.

With reference now to FIG. 13, an exemplary embodiment of a second-order model of a DC link capacitor is provided. FIG. 13 shows at least an equivalent series inductance ($L_{ESL}$), an equivalent series resistance ($R_{ESR}$), and a DC-link capacitance ($C_{DC}$). As described herein, in some embodiments, $R_{ESR}$ increases as the capacitor ages and $C_{DC}$ decreases as the capacitor ages. It should be appreciated that the general inventive concepts may be applied to additional capacitor models beyond the one shown in FIG. 13. These models may be selected to realize the design goals of the implementation.

Figures 14A, 14B:
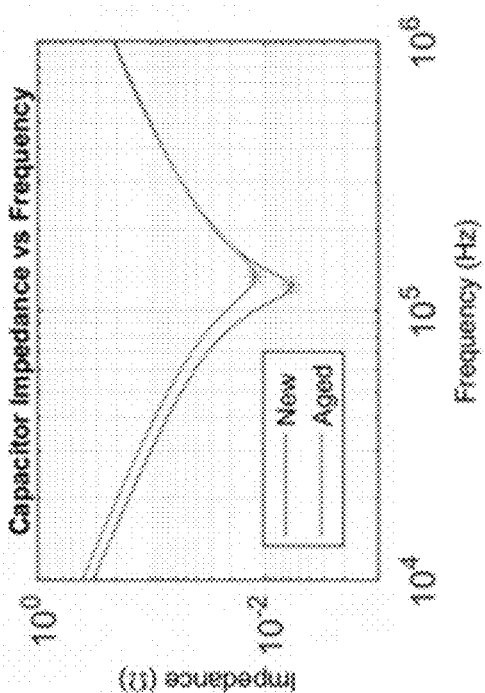
FIG. 14A illustrates parameters for two exemplary second-order capacitor models, in accordance with the general inventive concepts.
FIG. 14B illustrates an impedance of the two second-order capacitor models of FIG. 14A, in accordance with the general inventive concepts.

With reference now to FIG. 14A and FIG. 14B, FIG. 14A shows parameters for two second-order capacitor models. As shown in this exemplary embodiment, the aged capacitors values are 80% of $C_{DC}$, and two-times $R_{ESR}$, while $L_{ESL}$ remains the same. FIG. 14B shows the impedance of the two capacitors versus frequency. Below 100 kHz, the magnitude of the Aged Capacitor may be higher than a new capacitor. Its peak at the resonant frequency, represented by the star, is also higher. Additionally, the resonant frequencies of these two capacitors may be different. The differences are measurable in the electromagnetic spectrum of power electronics.

Figure 15:
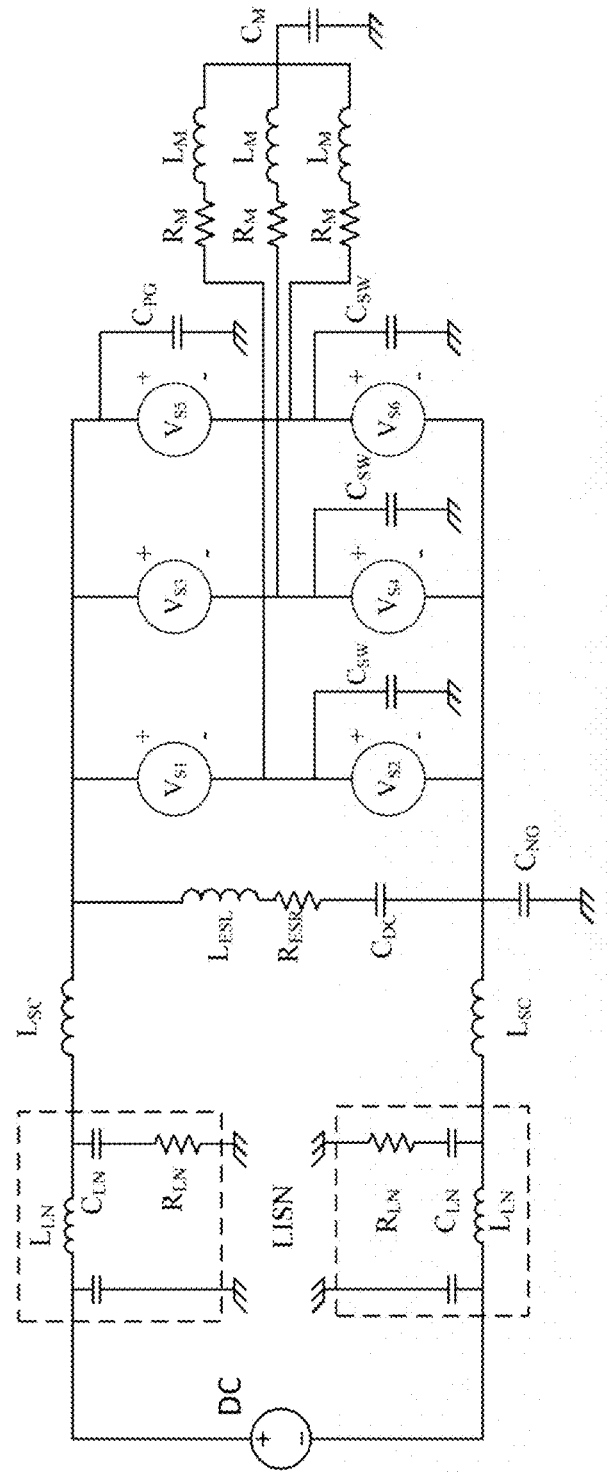
FIG. 15 illustrates an exemplary embodiment of a schematic used to model EMI behavior, in accordance with the general inventive concepts.

With continued reference to the figures, and with reference now to FIG. 15, FIG. 15 shows an exemplary scheme used to model the EMI behavior of a three-phase inverter. In some embodiments, the DC link capacitor (104 in FIG. 1) may be represented by second-order DC-link model via $L_{ESL}$, $R_{ESR}$, and $C_{DC}$. Additionally, or alternatively, the transistors (106 in FIG. 1) may be represented by $V_{S1}$ to $V_{S6}$, and the cable 110 and the machine 108 may be represented by $R_M$, $L_M$ and $C_M$. In some embodiments, the measurement hardware/LISN may be represented by $R_{LN}$, $L_{LN}$ and $C_{LN}$. The cable connecting the inverter to the DC source may also be represented by $L_{SC}$, with additional noises paths represented by $C_{NG}$, $C_{PG}$, and $C_{SW}$.

Figure 16:
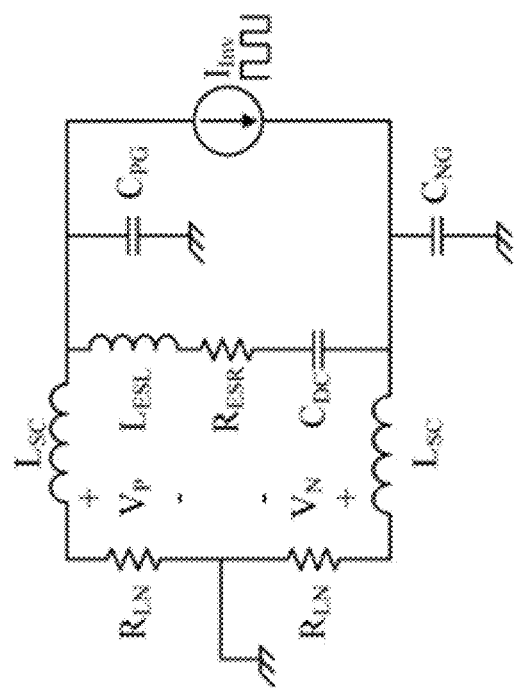
FIG. 16 illustrates a high-frequency representation of the schematic of FIG. 15, in accordance with the general inventive concepts.

With continued reference to the figures, and with reference now to FIG. 16, FIG. 16 shows an exemplary embodiment of a simplified high-frequency representation of the schematic in FIG. 15. In this exemplary embodiment, the relationship between the DC Link capacitor's health and the EMI spectrum is provided and useful for operation around the resonant frequency of the DC link capacitors. It should be appreciated that, in other embodiments, other (different) elements of the frequency spectrum may be utilized to assess the capacitor's health.

Figure 17:
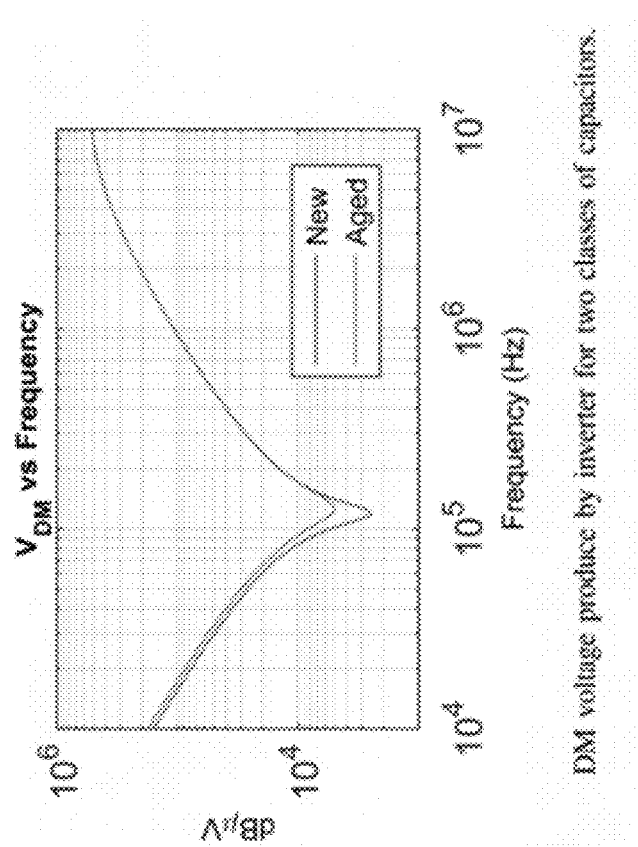
FIG. 17 illustrates a plot of the frequency response of FIG. 16, in accordance with the general inventive concepts.

With continued reference to the figures, and with reference now to FIG. 17, FIG. 17 shows a plot of the frequency response for the equation X derived, for example, from FIG. 16. In this exemplary embodiment, at least two capacitor conditions are provided, a new capacitor and a capacitor at its end of life. As shown in the figure, the magnitude of the response may be higher below the resonant frequency (the low point in each graph). Additionally, the magnitude of at the resonant frequency may be higher as the resonant frequency shifts upwards as the capacitor ages.

Figure 18:
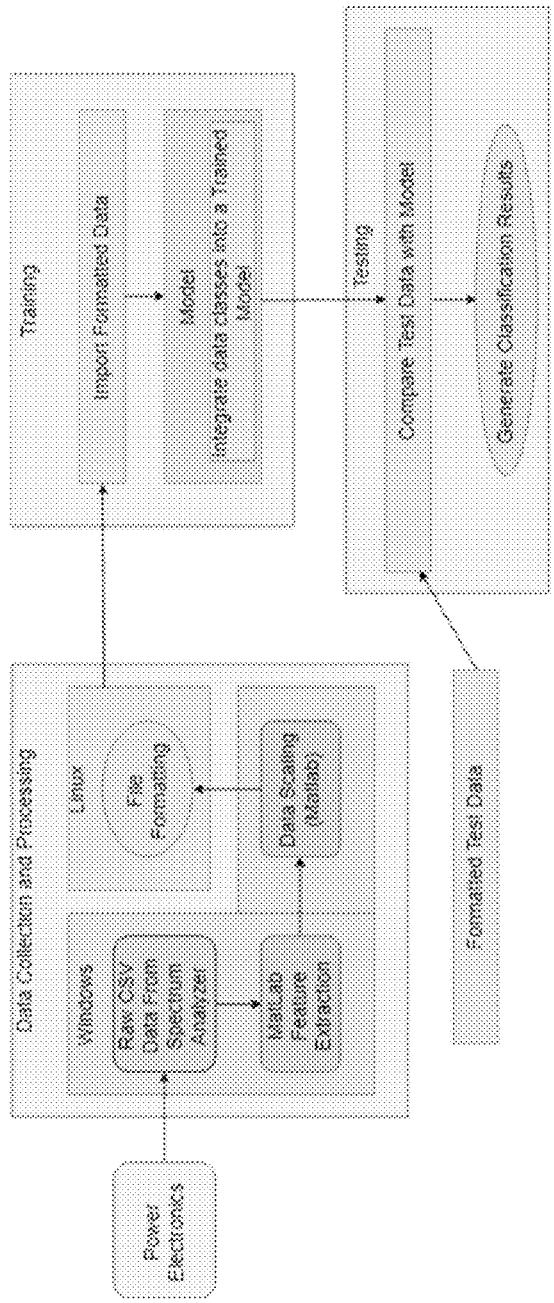
FIG. 18 illustrates an exemplary embodiment of a block diagram of an algorithm for a diagnostic procedure, in accordance with the general inventive concepts.

With reference now to FIG. 18, an exemplary block diagram for training a machine algorithm to determine a model is provided. It should be appreciated that the power electronic EMI may be measured via a spectrum analyzer. In this exemplary embodiment, the data may be exported to MATLAB where it may be processed prior to being applied to a machine learning algorithm. Once the results are compared against the model, the machine learning algorithm classifies the data into one of the prescribe categories.

Figure 19:
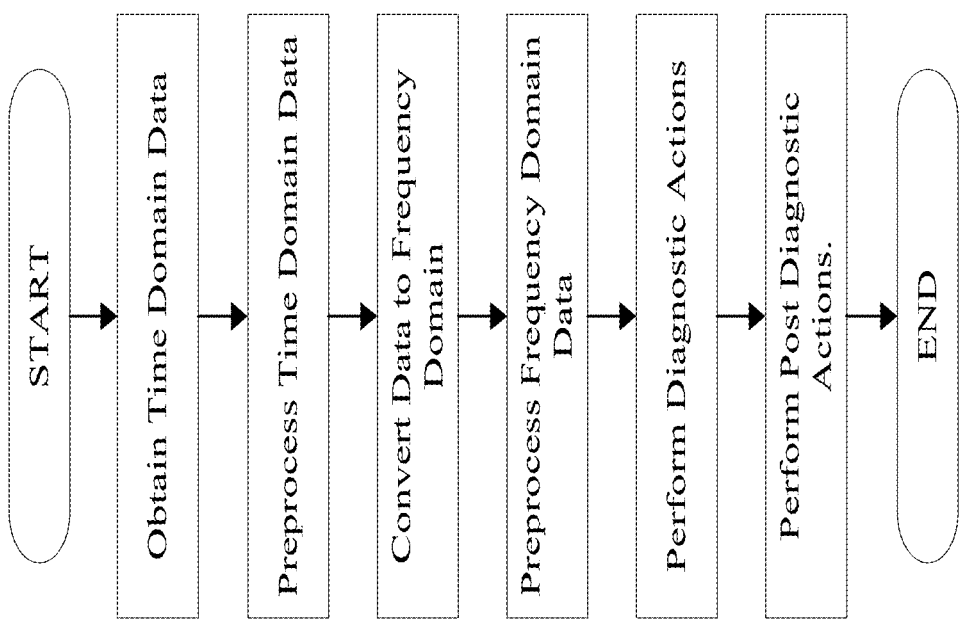
FIG. 19 illustrates another exemplary embodiment of a block diagram of an algorithm for a diagnostic procedure, in accordance with the general inventive concepts.

With continued reference to the figures, and with reference now to FIG. 19, FIG. 19 shows a block diagram of the algorithm for diagnostic procedure. In this embodiment, for example, the electromagnetic spectrum is captured as a set of time domain signals. In some embodiments, the time domain signals may be measured using a measurement device such as an oscilloscope or spectrum analyzer. Additionally, or alternatively, measurements may be achieved by voltage or current sensors. Additionally, or alternatively, the exemplary embodiments shown in FIG. 8 and/or FIG. 9 may be used to measure time domain signals.

In some embodiments, the captured signals may undergo preprocessing prior before being converted to the frequency domain. These actions may include, but are not limited to, filtering or zero-padding. In some embodiments, the resulting frequency domain data may undergo preprocessing that may include, but is not limited to, filtering and smoothing. The resulting frequency domain data may be supplied to a machine learning algorithm, or other analytical method, that will perform a diagnostic action. In some embodiments, the results of the diagnostic action may be stored and/or transmitted to a user.

Figures 20A, 20B:
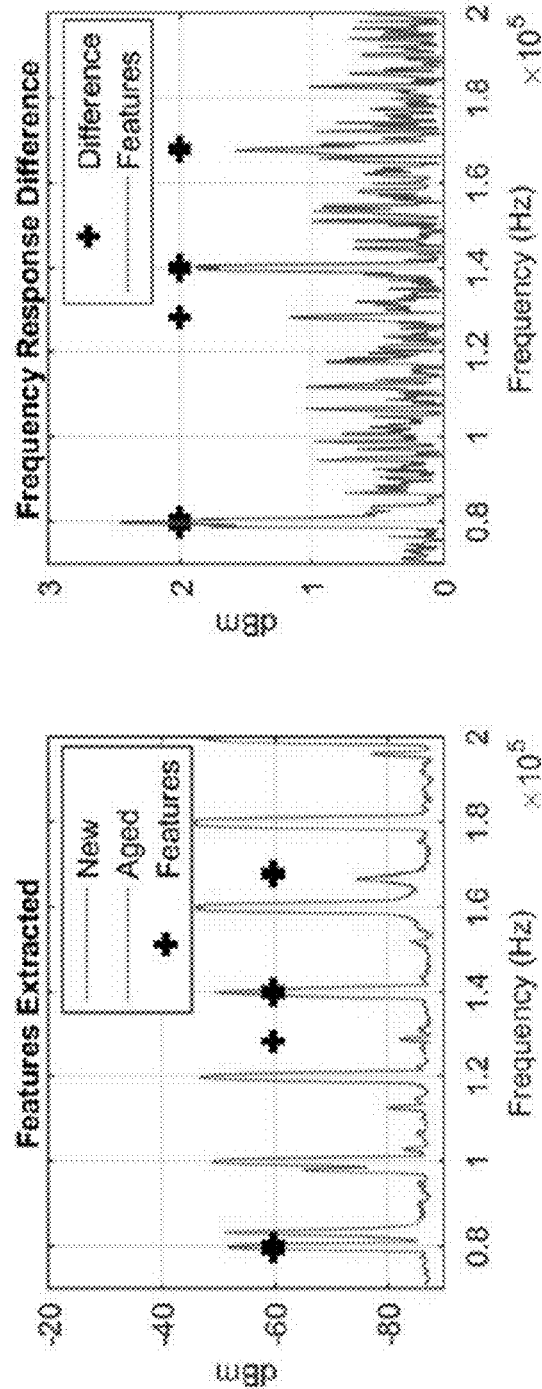
FIG. 20A illustrates an exemplary embodiment of a frequency spectrum of measure time domain data, in accordance with the general inventive concepts.
FIG. 20B illustrates another exemplary embodiment of a frequency spectrum of measure time domain data, in accordance with the general inventive concepts.

With continued reference to the figures, and with reference now to FIG. 20A and FIG. 20B, FIG. 20A shows a frequency spectrum of measured time domain data. In this embodiment, the range of measurements are just below and above the resonant frequency as shown in FIG. 14B. The features (e.g., as used in MLA) indicate the spectral content that is used in the machine learning algorithm to determine the capacitors health. It should be appreciated that each feature may be a magnitude measured at a specific frequency. The MLA evaluates the magnitudes and frequencies as part of the diagnostic action and determines the capacitors health.

FIG. 20B shows that the features occur at frequencies where the difference between the data is highest. That is, FIG. 20B justifies the selection of the features by showing that the difference the capacitors' magnitudes is highest at these points. In some embodiments, for example, only a portion of the data may be used for determining the relevant features for the MLA.

Figures 21A, 21B:
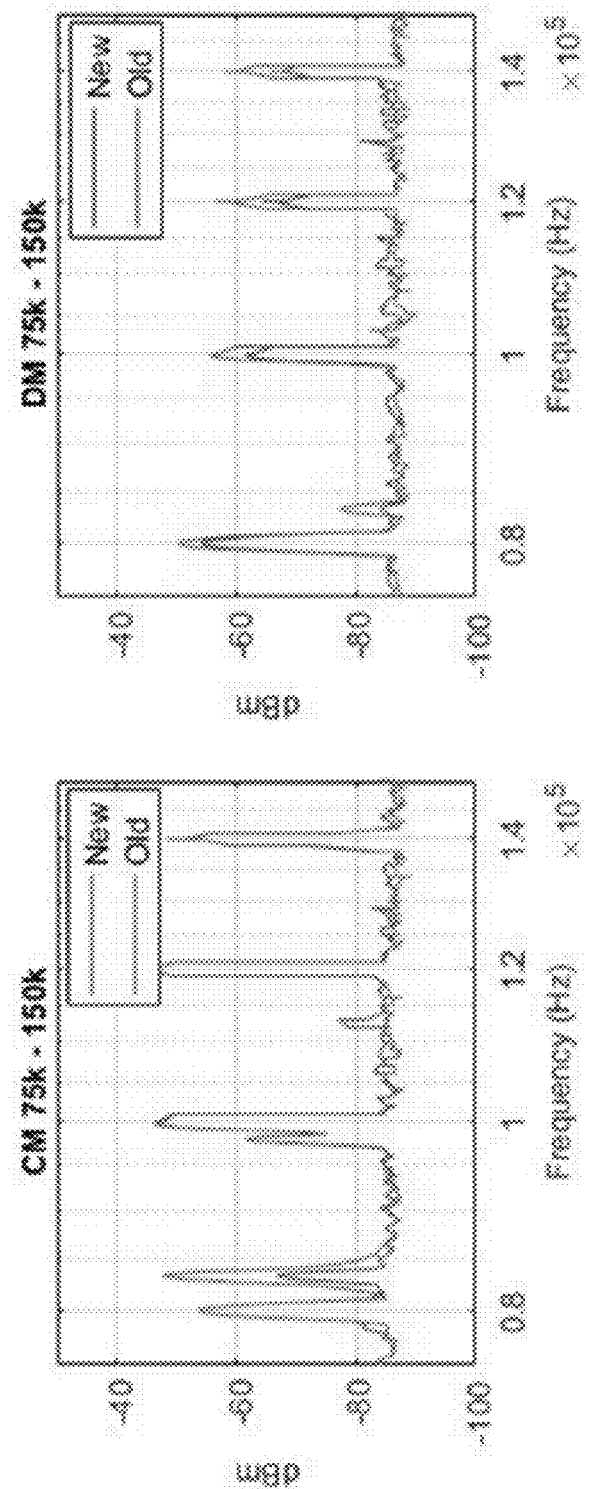
FIG. 21A illustrates an exemplary embodiment of a noise measurement in a common-mode, in accordance with the general inventive concepts.
FIG. 21B illustrates an exemplary embodiment of a noise measurement in a differential-mode, in accordance with the general inventive concepts.

With continued reference to the figures, and with reference now to FIG. 21A and FIG. 21B, at least two types of noise measurements are provided, for example, a common-mode (CM) and differential-mode (DM). FIG. 21A shows the common-mode noise for both capacitor classes around the resonant frequency of the DC-Link capacitors. FIG. 21B shows the differential-mode noise for both capacitor classes around the resonant frequency of the DC-Link capacitor. It should be appreciated that the magnitude of noise may be lower for new DC-link capacitors versus aged DC-link capacitors, which agrees, for example, with the DM model shown in FIG. 16.

Figures 22A, 22B:
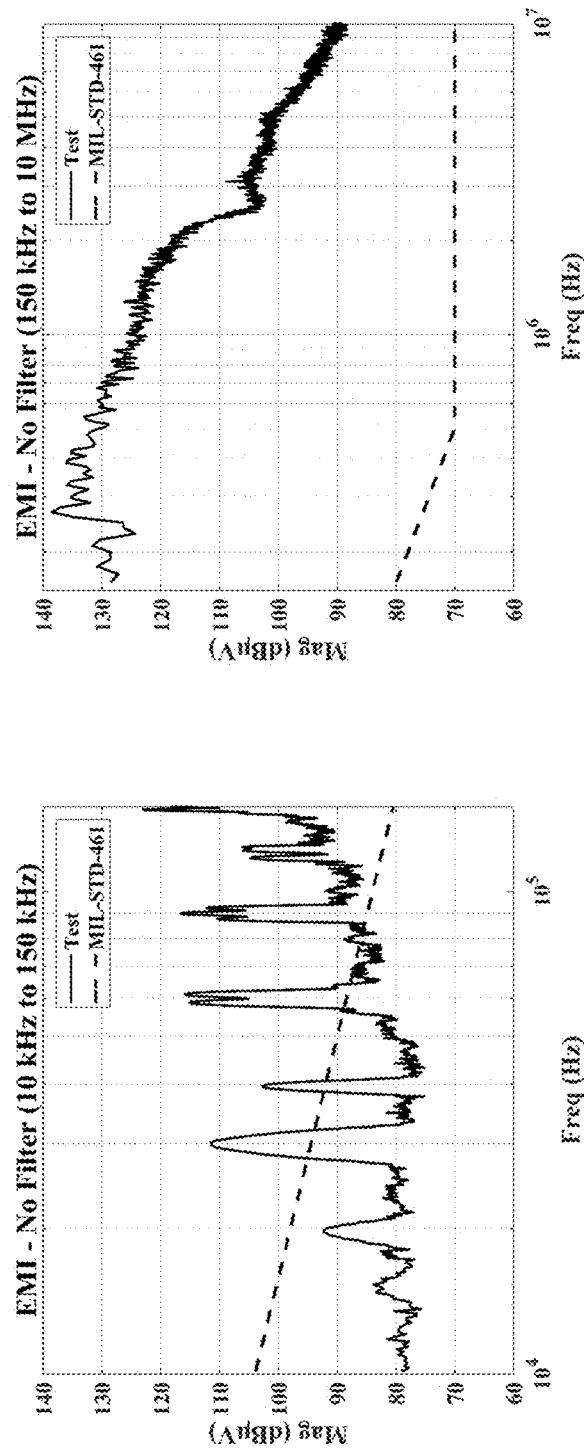
FIG. 22A illustrates a first exemplary embodiment of a representative measurement of a conducted electromagnetic spectrum, in accordance with the general inventive concepts.
FIG. 22B illustrates a second exemplary embodiment of a representative measurement of a conducted electromagnetic spectrum, in accordance with the general inventive concepts.

With reference now to FIG. 22A and FIG. 22B, at least two representative measurements of the conducted electromagnetic spectrum produced by a three-phase inverter are provided. As shown, the images are broken into two bandwidths according to MIL-STD-461, which is the Department of Defense's EMI Standard. The measurement data is represented by the solid line. The maximum value is represented by the dashed line. In some embodiments, when measurement data exceeds this threshold, as it does in FIG. 22A and FIG. 22B, an EMI filter will be required to comply with the EMI Standard.

Figures 23A, 23B:
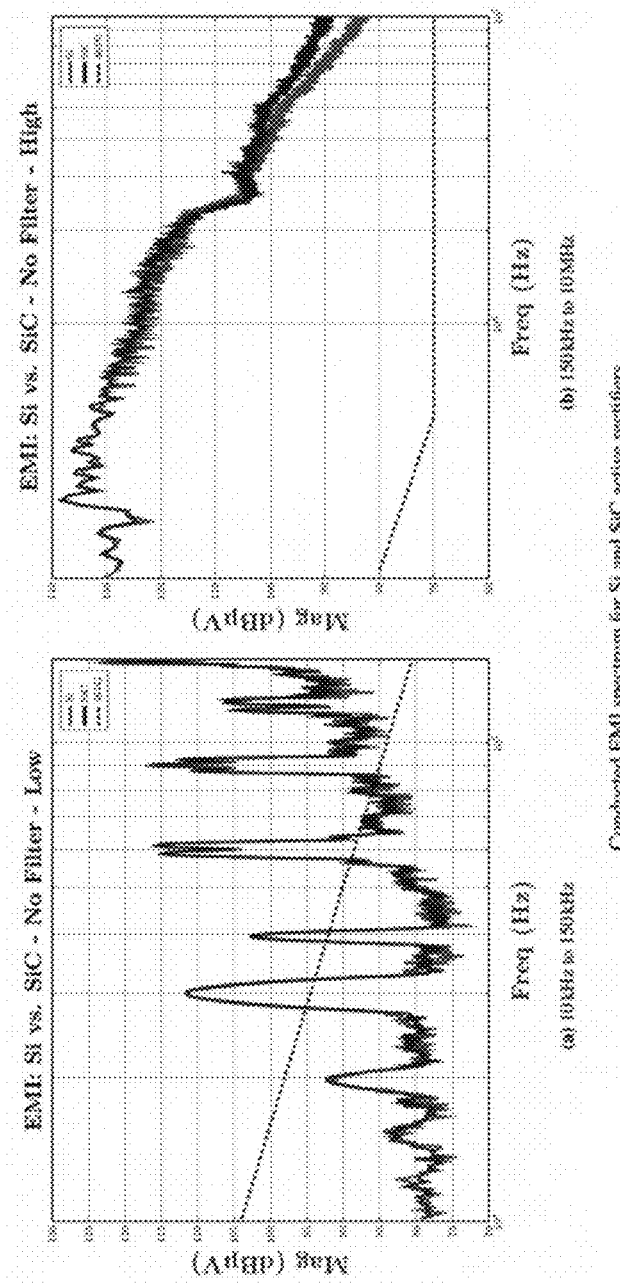
FIG. 23A illustrates a third exemplary embodiment of a representative measurement of a conducted electromagnetic spectrum, in accordance with the general inventive concepts.
FIG. 23B illustrates a fourth exemplary embodiment of a representative measurement of a conducted electromagnetic spectrum, in accordance with the general inventive concepts.

With continued reference to the figures, and with reference now to FIG. 23A and FIG. 23B, the results shown in FIG. 23A and FIG. 23B are similar to the results in FIG. 22A and FIG. 22B, respectively, except that FIG. 23A and FIG. 23B show two test results as compared to the single test result shown in FIG. 22A and FIG. 22B. The two test results of FIG. 23A and FIG. 23B demonstrate that different semiconductor materials may have different frequency spectrums at higher frequencies.

Figure 24:
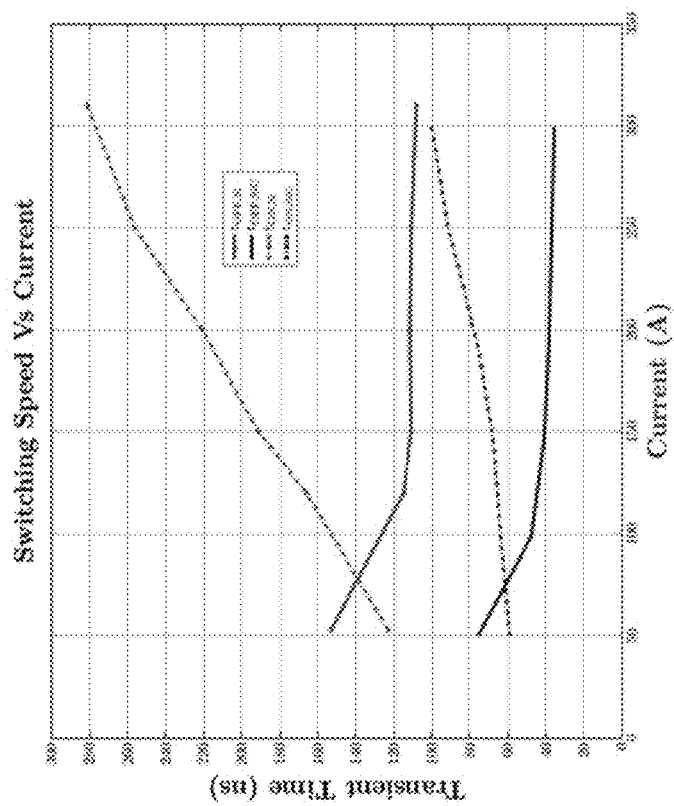
FIG. 24 illustrates an exemplary embodiment of switch speeds for transistors at different operating currents, in accordance with the general inventive concepts.

With reference now to FIG. 24, this exemplary embodiments shows switching speeds for at least two types of transistors which may be operating at different operating currents. In some embodiments, these switching speeds may directly impact the conducted EMI. For example, as the operating current increases, the switching speed may decrease. This embodiment may produce more conducted EMI an may be used to predict the current through a transistor.

Figure 25:
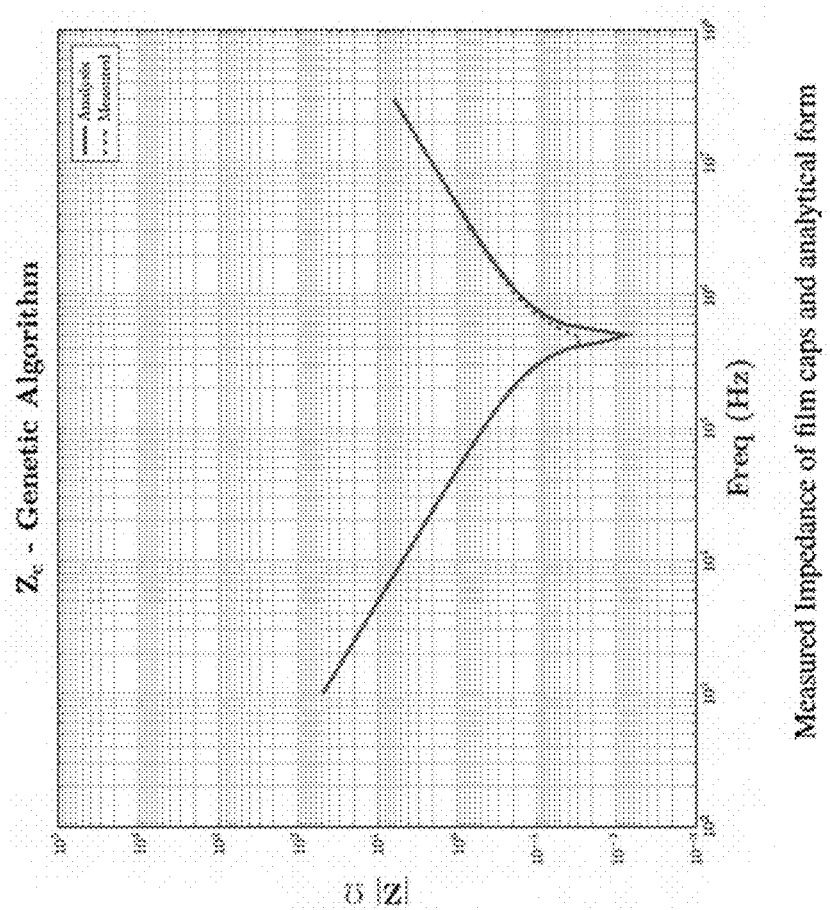
FIG. 25 illustrates an exemplary embodiment of a measured and estimated impedance of a film capacitor, in accordance with the general inventive concepts.

With reference now to FIG. 25, a film capacitor's measure and estimated impedance is provided. As shown, the dotted line represents the measured value. A genetic algorithm may utilize this measurement data to approximate the values of the equivalent series inductance ($L_{ESL}$), the equivalent series resistance ($R_{ESR}$), and/or the DC-link capacitance ($C_{DC}$). As shown, the solid line represents the results of the genetic algorithm estimates. It should be appreciated that, in some embodiments, the genetic algorithm may use measurement data to estimate the parameters of one or more components, for example, in an inverter. It should be further appreciated that this can be used to predict the health of any of the components in power electronics.

Figure 26B:
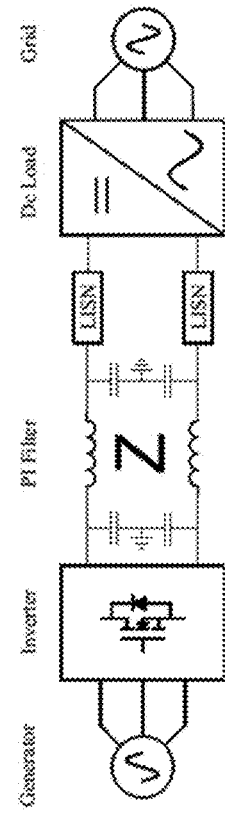
FIG. 26B illustrates an exemplary embodiment of a schematic of an EMI measurement setup for a motor drive system, in accordance with the general inventive concepts.
Figure 26A:
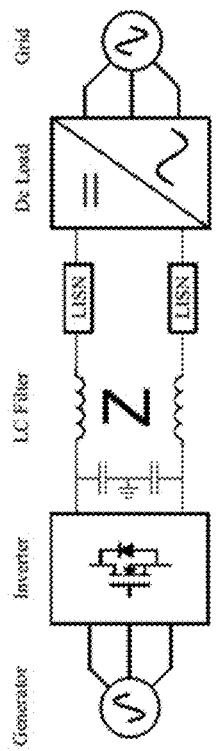
FIG. 26A illustrates an exemplary embodiment of an EMI measurement setup for a motor drive system, in accordance with the general inventive concepts.

With continued reference to the figures, and with reference now to FIG. 26A and FIG. 26B, FIG. 26A shows an EMI measurement setup for motor drive system. An LC Filter (e.g., as shown in FIG. 8 and/or FIG. 9) may be inserted between the inverter and the LISNs used to measure the inverter EMI. The measurement method of FIG. 12A and/or FIG. 12B may be applied here using one or more of the methods demonstrated in FIG. 10A, FIG. 10B, and/or FIG. 11.

FIG. 26B shows a schematic of an exemplary EMI measurement setup for a motor drive system. In this exemplary embodiment, a PI-Filter may be used as opposed to an LC-Filter. In some embodiments, the measurement method in FIG. 12B may be implemented in the exemplary EMI measurement setup using the method of FIG. 10A and/or FIG. 10B.

Figure 27:
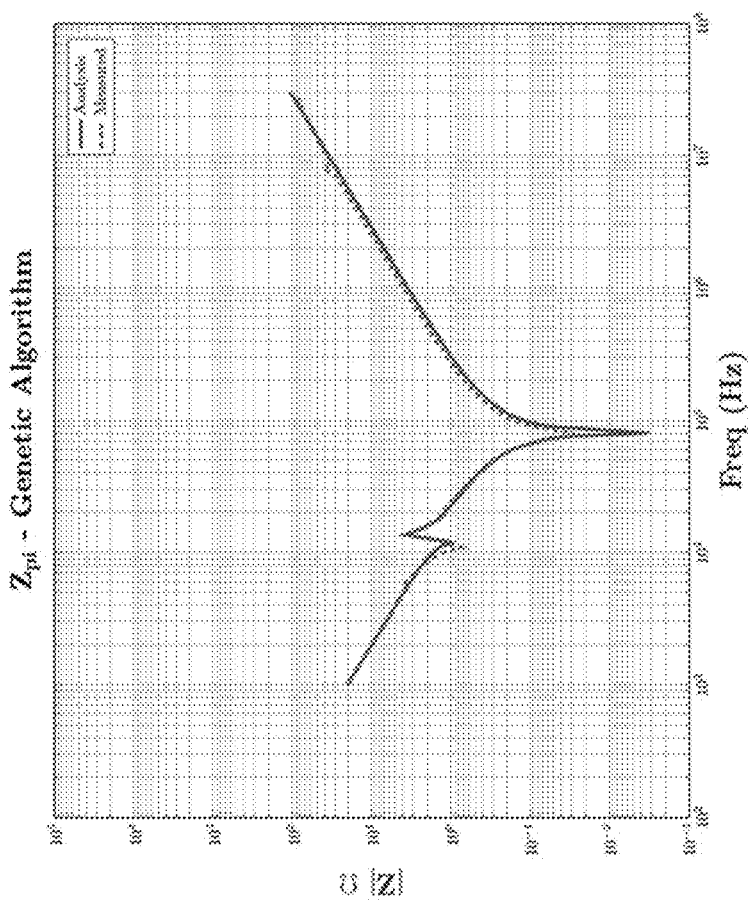
FIG. 27 illustrates an exemplary embodiment of a genetic algorithm, in accordance with the general inventive concepts.
Figure 28:
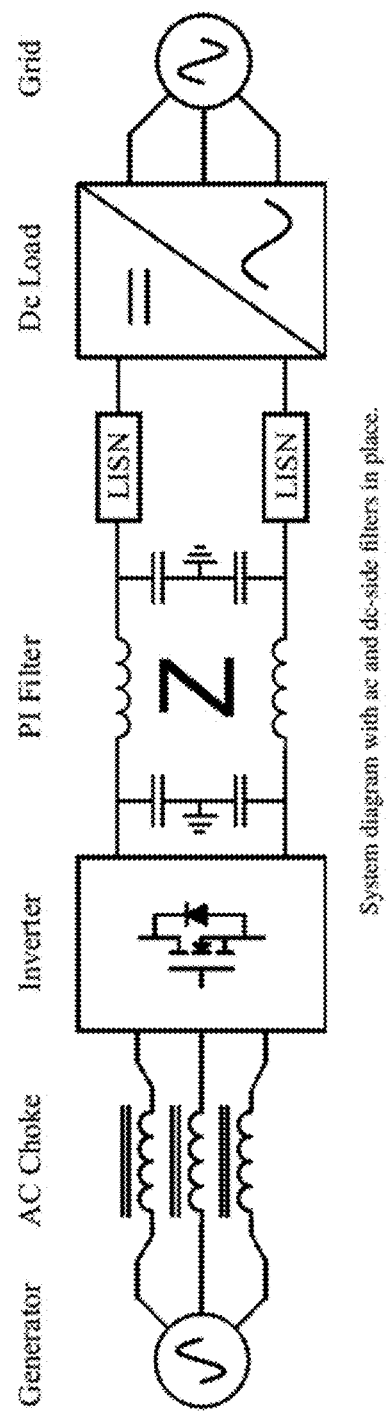
FIG. 28 illustrates an exemplary embodiment of a second schematic of an EMI measurement setup for a motor drive system, in accordance with the general inventive concepts.

With reference now to FIG. 27, FIG. 27 shows the frequency response of the PI filter of FIG. 26B. In this embodiment, for example, a genetic algorithm for approximating values of more complex systems using measurement data may be provided. With continued reference to the figures, and with reference now to FIG. 28, FIG. 28 shows a further exemplary schematic of an EMI measurement setup for a motor drive system. In this embodiment, a PI-Filter may be utilized on the DC bus and an L-Filter may be utilized on the AC feed between the motor and the inverter. In some embodiments, the measurement method given in FIG. 12A and/or 12B may be implemented in this embodiment using a method of FIG. 10A, FIG. 10B, and/or FIG. 11.

Figures 29A, 29B:
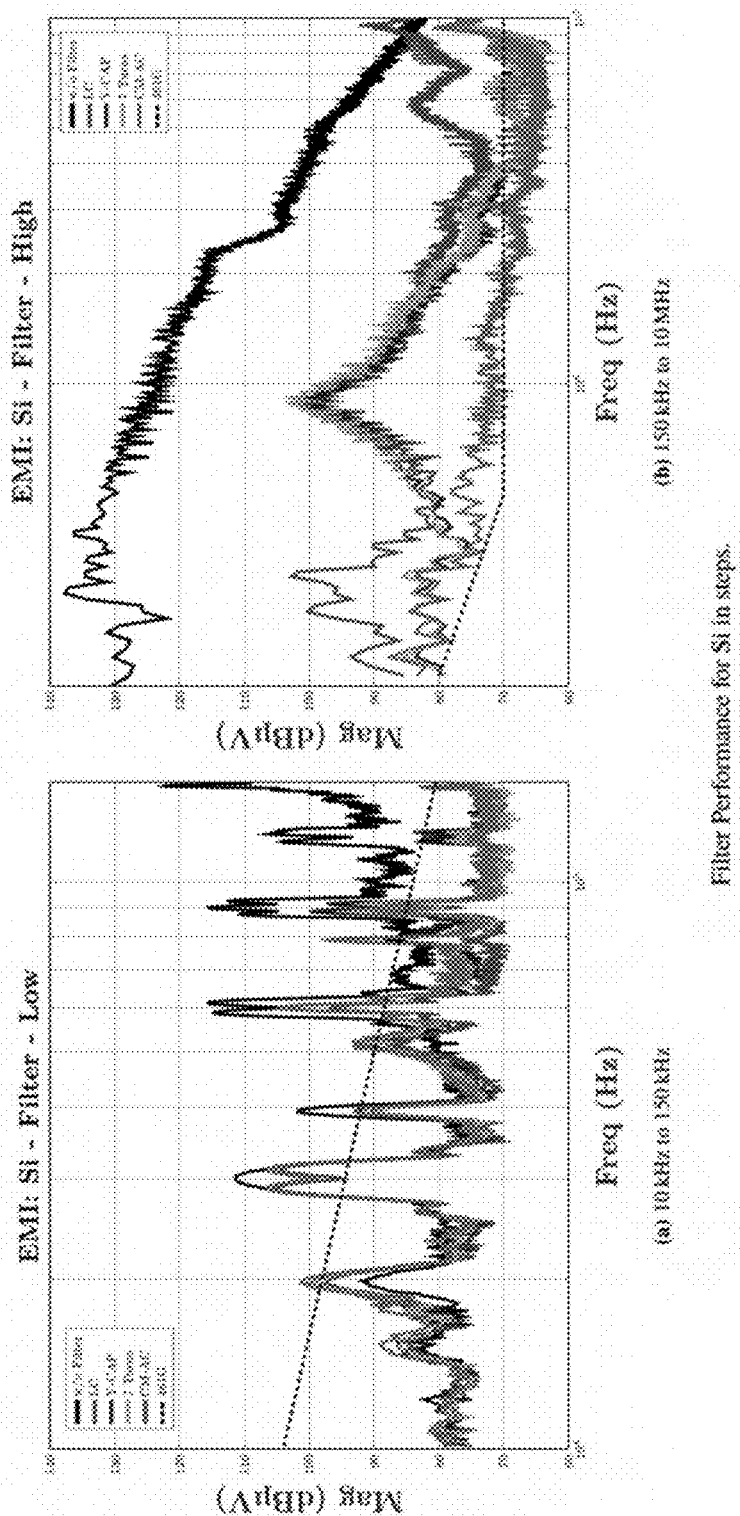
FIG. 29A illustrates an exemplary embodiment of a conducted EMI generated by a motor at 40 kVA, in accordance with the general inventive concepts.
FIG. 29B illustrates another exemplary embodiment of a conducted EMI generated by a motor at 40 kVA, in accordance with the general inventive concepts.

With reference now to FIG. 29A and FIG. 29B, FIG. 29A and FIG. 29B shows conducted EMI generated by a motor at 40 kVA. In these exemplary embodiments, measurements are made in accordance with MIL-STD-461. This standard defines two regions of measurement, with the black line as the unfiltered EMI noise. It should be appreciated that as different filters are added to the setup, the noise begins to be reduced to an acceptable level.

Figure 30B:
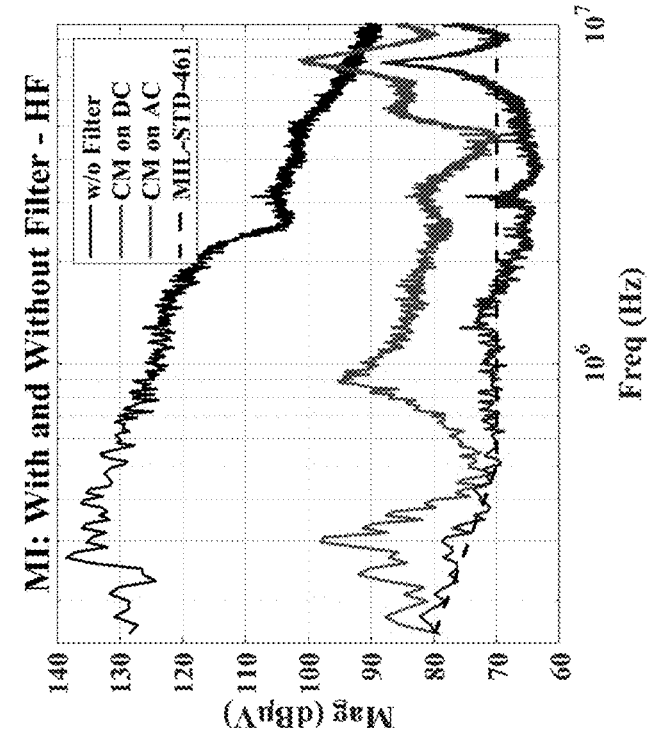
FIG. 30B illustrates additional exemplary data comparing filtered and unfiltered EMI measurements, in accordance with the general inventive concepts.
Figure 30A:
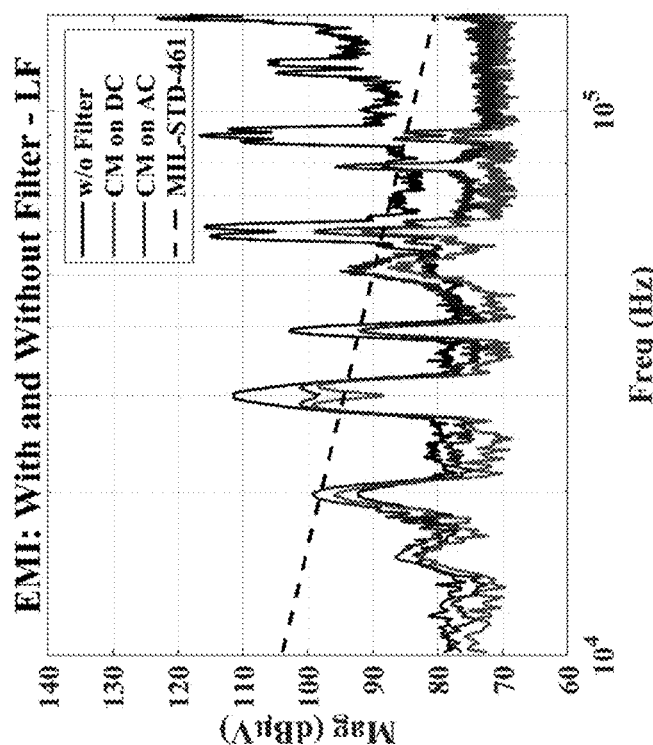
FIG. 30A illustrates exemplary data comparing filtered and unfiltered EMI measurements, in accordance with the general inventive concepts.

With continued reference to the figures, and with reference now to FIG. 30A and FIG. 30B, FIG. 30A and FIG. 30B compare the EMI measurements for at least three test cases. The first case is the same as FIG. 22A and/or FIG. 22B and includes unfiltered EMI data. The red waveform is the EMI measurements with a common-mode filter connected to the DC bus of the inverter. The blue waveform is the EMI measurements with additional filtering on the DC bus as well as a common-mode filter connected to the AC bus.

In some embodiments, adding the filters decrease the level of EMI so that it is closer to the Standard's threshold. In some embodiments, the general inventive concepts shown in FIG. 7B may be integrated with the EMI filter so that it achieves these results while simultaneously performing diagnostics actions.

Figures 31A, 31B:
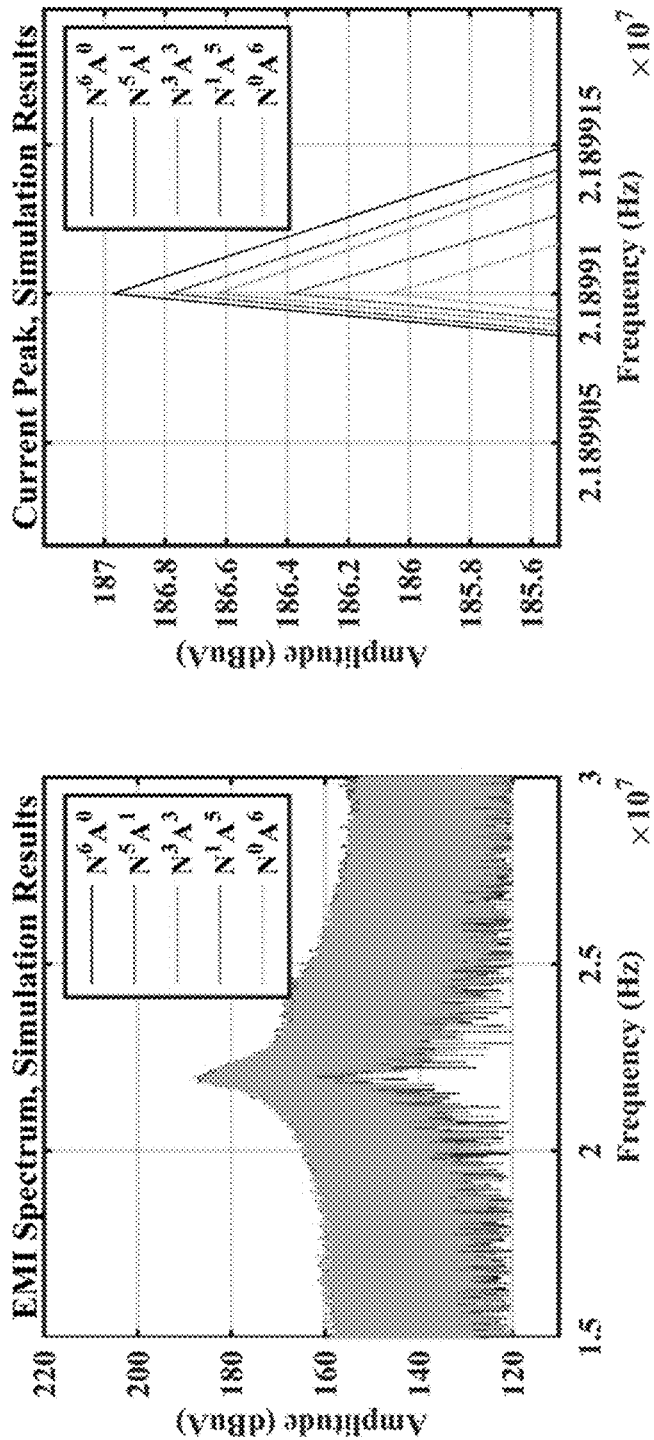
FIG. 31A illustrates exemplary data of a simulated high frequency behavior, in accordance with the general inventive concepts.
FIG. 31B illustrates a peak view of the simulated high frequency behavior of FIG. 31A, in accordance with the general inventive concepts.

With continued reference to the figures, and with reference now to FIG. 31A and FIG. 31B, another exemplary method is provided to measure a capacitor's health. It should be appreciated that, in this embodiment, the feature examines the high frequency oscillations (e.g., peaked at 21.9 MHz) produced by the transistor's output capacitance resonating with the stray inductance in the commutation loop.

FIG. 31A shows simulated high frequency spectrum for this behavior (e.g., the high frequency oscillations). It should be further appreciated, that as opposed to the embodiments of FIG. 14, FIG. 17, FIG. 20, and FIG. 21, the embodiments of FIGS. 31A and 31B show the change EMI as the capacitor health changes from new to old. Also, in some embodiments, the frequency and magnitude of each capacitor class may occur at a different level.

Further in the embodiment of FIG. 31A, a power system is created that avoids catastrophes resulting from old and/or failing components by identifying the old/failing components in real-time (i.e., without needed to disassemble the power system). This system allows the users to identify the age of the components, which may allow users to accurately plan (or budget) for replacement components.

FIG. 31B shows a zoomed-in view of the behavior peak. As shown, the magnitude of the peak decreases as the capacitor ages. This simulation also explores five stages of capacitor lifetime: 100% health, 83.3%, 50%, 16.7%, and aged. These are referred to capacitor classes. It should be appreciated that this method is different from the results in FIG. 21A and/or FIG. 21B. In some embodiments, the increase in ESR may cause additional damping in the circuit which may reduce the peak amplitude of the spectral content.

Figure 32B:
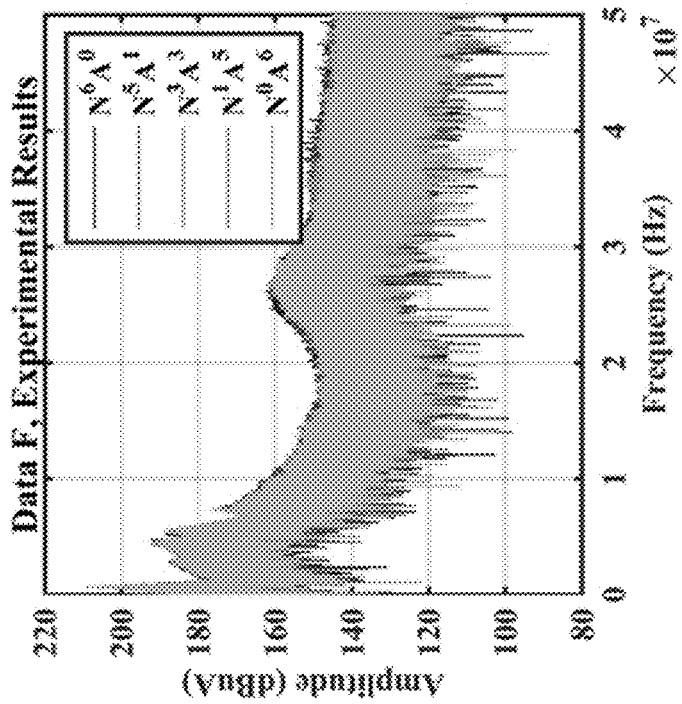
FIG. 32B illustrates exemplary frequency domain data, in accordance with the general inventive concepts.
Figure 32A:
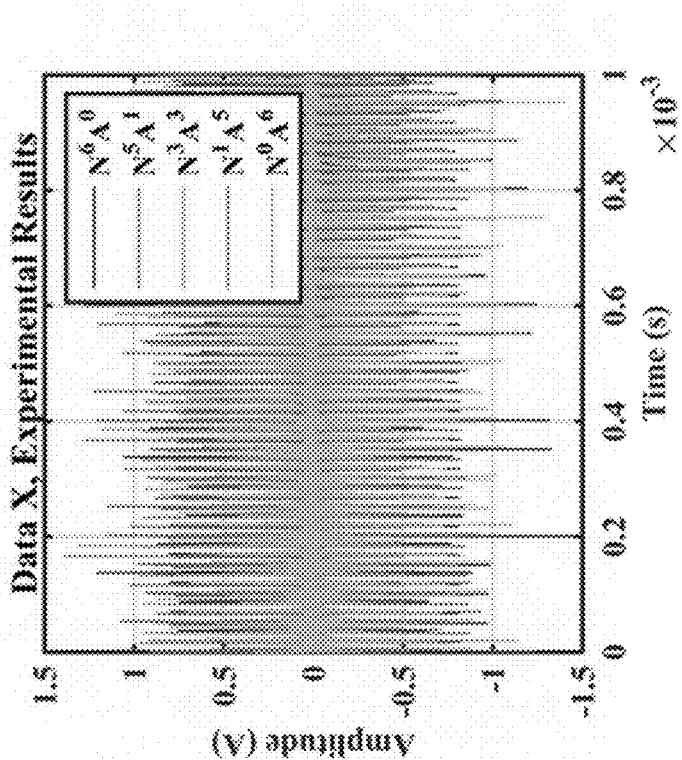
FIG. 32A illustrates exemplary time data captured with a current sensor, in accordance with the general inventive concepts.

With continued reference to the figures, and with reference now to FIG. 32A and FIG. 32B, FIG. 32A shows experimental time domain data captured with a current sensor. FIG. 32B shows a frequency domain data that resulted from performing a Fast Fourier Transform (FFT) on the data in FIG. 32A. It should be appreciated that this data shows the evolution of the applied algorithm in FIG. 19.

Figure 33:
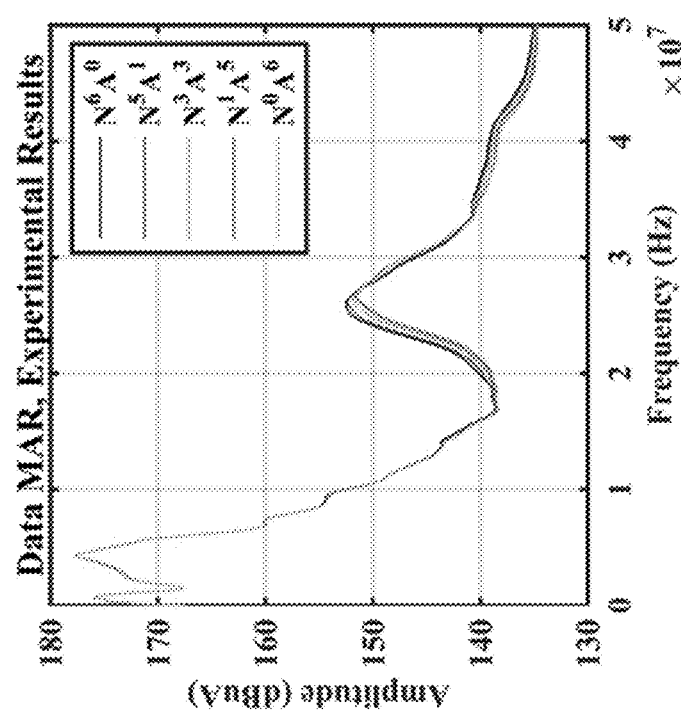
FIG. 33 illustrates an exemplary embodiment of an output of an algorithm that performs preprocessing of frequency domain data, in accordance with the general inventive concepts.

With continued reference to the figures, and with reference now to FIG. 33, FIG. 33 shows an output of the algorithm that performs preprocessing of the frequency domain data. In this exemplary embodiments, the noise may be removed from the signals and the spectral content of each capacitor class. Similar to the data of FIG. 32A and FIG. 32B, this data shows the evolution of the applied algorithm in FIG. 19.

Figure 34:
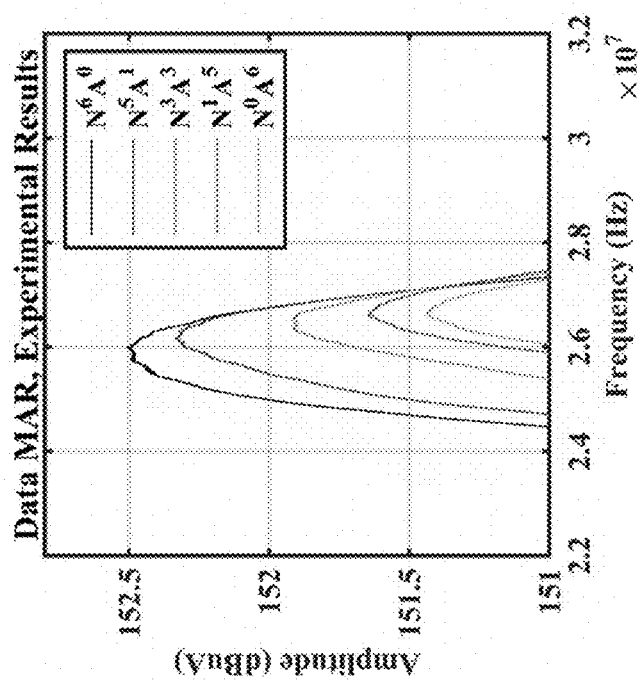
FIG. 34 illustrates exemplary results after signal processing techniques, in accordance with the general inventive concepts.

With continued reference to the figures, and with reference now to FIG. 34, FIG. 34 shows the experimental results after signal processing techniques have been applied to a five capacitor classes' data. As shown, there is a clear delineation of capacitor health. It should be appreciated that the experimental results match the simulation results in FIG. 31B.

Figure 35A:
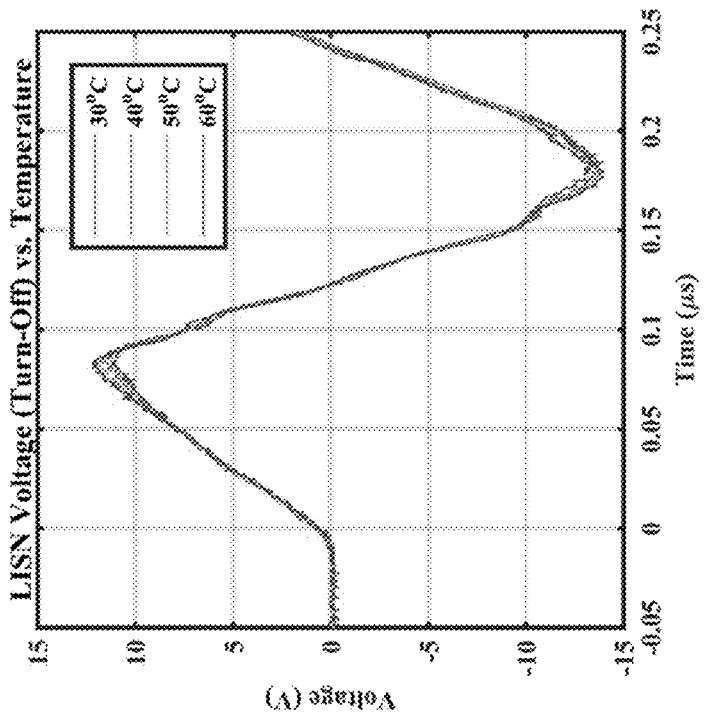
FIG. 35A illustrates an exemplary embodiment of a drain-to-source measurement voltage, in accordance with the general inventive concepts.
Figure 35B:
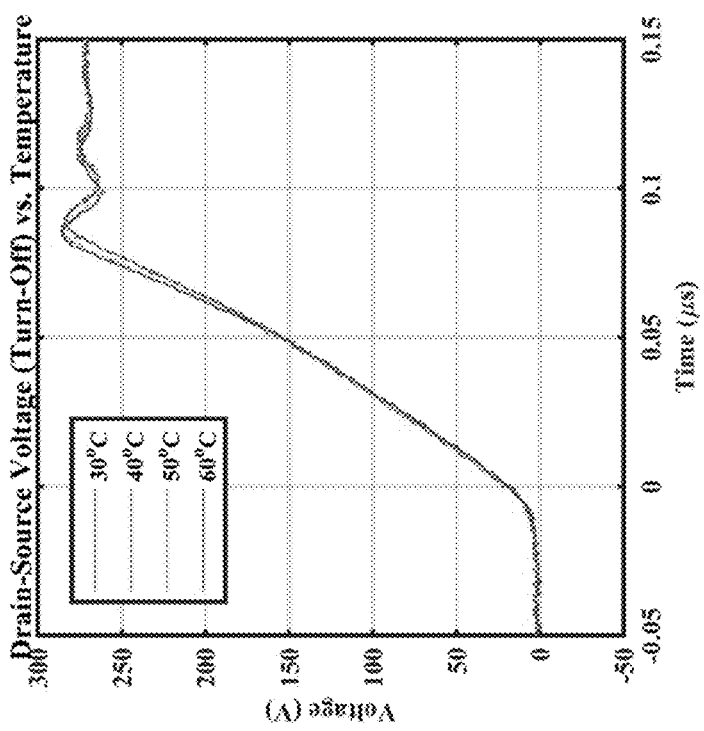
FIG. 35B illustrates the measurement voltage of FIG. 35A at terminals o a line impedance stabilization network, in accordance with the general inventive concepts.

With reference now to FIG. 35A and FIG. 35B, embodiments of the general inventive concept may be used to monitor the health of transistor switching devices. FIG. 35A shows a measurement of a drain-to-source voltage across a metal oxide semiconductor field effect transistor (MOSFET) for three different temperatures. In some embodiments, as shown, the rise time may change with temperature. FIG. 35B shows the measured voltage at the terminals of a line impedance stabilization network (LISN). This this exemplary embodiment, the switching behavior of the power electronics may impact the EMI. The difference between each temperature's waveform is also shown.

Figure 36B:
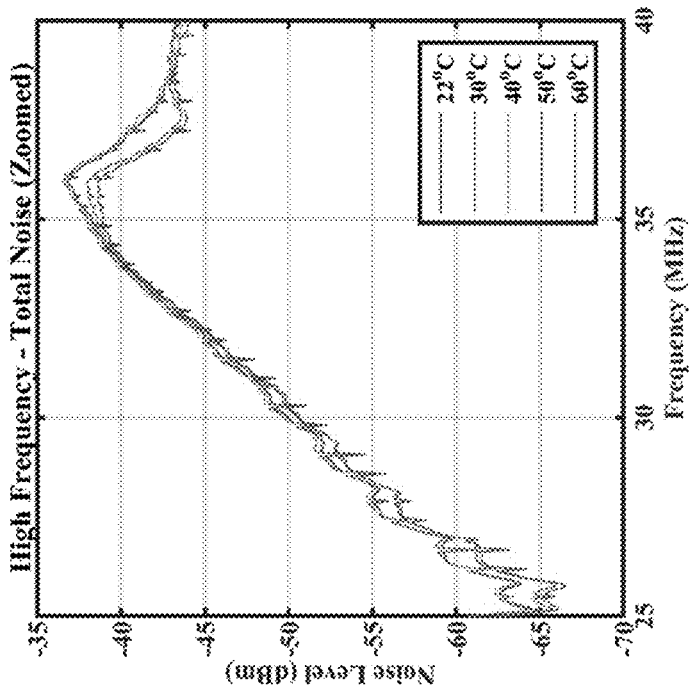
FIG. 36B illustrates a zoomed peak of the high frequency spectrum of FIG. 36A, in accordance with the general inventive concepts.
Figure 36A:
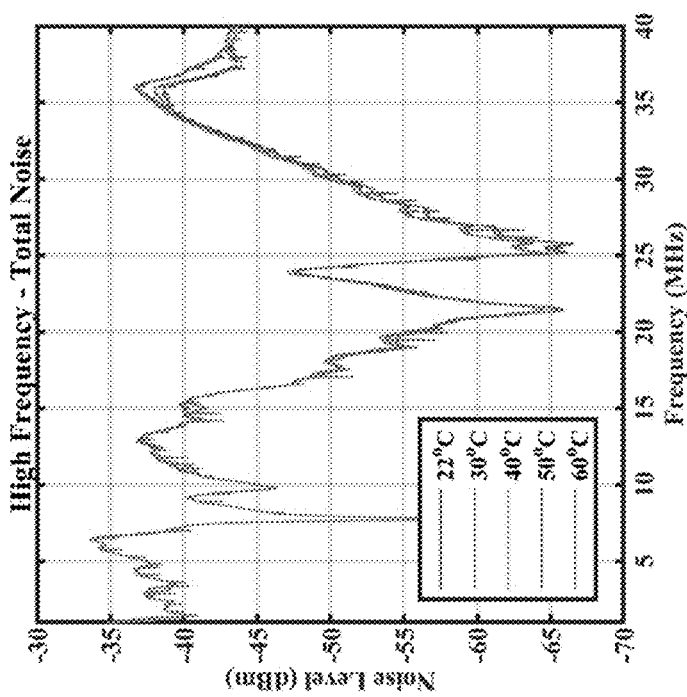
FIG. 36A illustrates an exemplary embodiment of a high frequency spectrum of power electronics, in accordance with the general inventive concepts.

With continued reference to the figures, and with reference now to FIG. 36A and FIG. 36B, FIG. 36A shows a high frequency spectrum of the power electronics. In this embodiment, the spectrum changes as the temperature increases, for example, at frequencies above 25 MHz. In the embodiment of FIG. 36B, the increase is more noticeable. It should be appreciated that this spectral content may be utilized with the algorithm of FIG. 19 to estimate a junction temperature of a MOSFET.

Figures 37A, 37B:
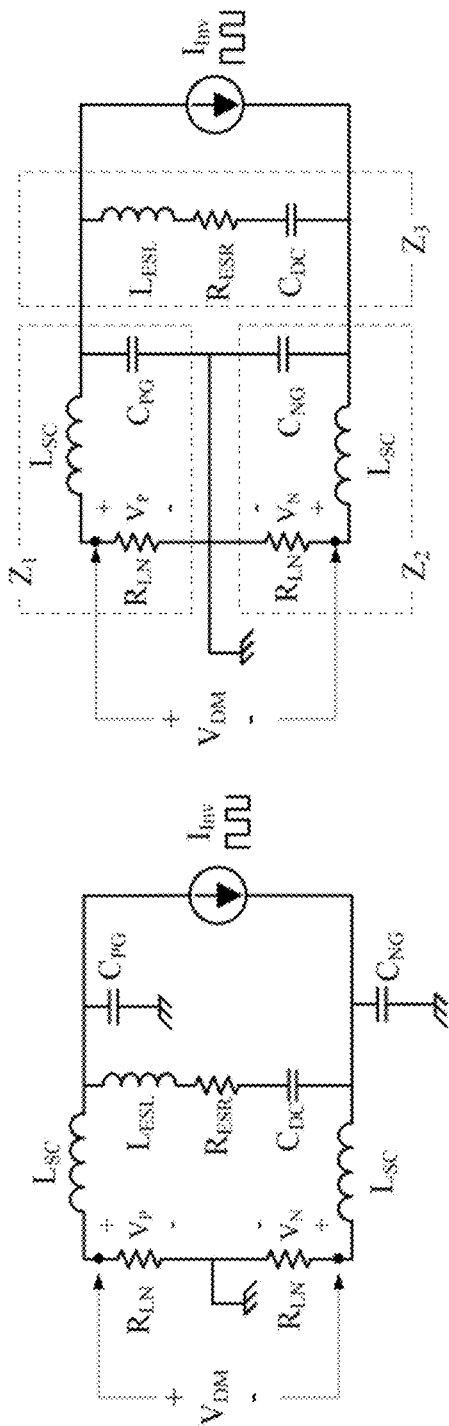
FIG. 37A illustrates another high-frequency representation of the schematic of FIG. 15, in accordance with the general inventive concepts.
FIG. 37B illustrates yet another high-frequency representation of the schematic of FIG. 15, in accordance with the general inventive concepts.

With continued reference to the figures, and with reference now to FIG. 37A and FIG. 37B, FIG. 37A shows a further exemplary embodiment of a simplified high-frequency representation of the schematic in FIG. 15. In this exemplary embodiment, the relationship between the DC Link capacitor's health and the EMI spectrum is provided and useful for operation around the resonant frequency of the DC link capacitors. The transfer function between the input current and the differential mode DM voltage ($V_{DM}$) at the LISN terminals may be calculated using basic circuit analysis. In some embodiments, the circuit (component) in FIG. 37B may be converted into the complex impendences $Z_1$, $Z_2$, and $Z_3$, with:

$$Z_1 = \frac{(R_{LN} + sL_{SC})\left(\frac{1}{sC_{PG}}\right)}{R_{LN} + sL_{SC} + \frac{1}{sC_{PG}}},$$

$$Z_2 = \frac{(R_{LN} + sL_{SC})\left(\frac{1}{sC_{NG}}\right)}{R_{LN} + sL_{SC} + \frac{1}{sC_{NG}}}, \text{ and}$$

$$Z_3 = R_{ESR} + sL_{ESL} + \frac{1}{sC_{DC}}.$$

It should be appreciated that using these complex impendences, the voltage at the LISN's positive terminal ($V_P$) and negative terminal ($V_N$) are derived and this yields $V_{DM}$, with:

$$V_P = \frac{R_{LN}}{R_{LN} + sL_{SC}}\left(Z_1\left(\frac{Z_3}{Z_1 + Z_2 + Z_3}\right)\right)I_{INV}(s),$$

$$V_N = \frac{R_{LN}}{R_{LN} + sL_{SC}}\left(-Z_2\left(\frac{Z_3}{Z_1 + Z_2 + Z_3}\right)\right)I_{INV}(s), \text{ and}$$

$$V_{DM} = \frac{V_P - V_N}{2}.$$

It should be understood by one of ordinary skill in the art that these examples are to illustrate the concept as applied to a particular circuit or circuit component and thus, the concepts described can be applied to other components and fault conditions by identifying the component or fault and modeling the potential failure as described herein.

It should be further understood that any results described herein may be provided or otherwise presented to a user via a display (e.g., using a user interface in operable communication with one or more systems of the general inventive concepts described herein) and/or in audible (e.g., via a speaker or similar component in operable communication with one or more systems of the general inventive concepts described herein.) Additionally, or alternative, the results may be presented or otherwise delivered via indicia or other means known in the art for identifying a failed and/or compromised component.

The components and/or materials described hereinafter as making up the various embodiments are intended to be illustrative and not restrictive. It should be appreciated that many suitable components and materials that would perform the same or a similar function as the materials described herein are intended to be embraced within the scope of embodiments of the present disclosure. Furthermore, the term "module" or "engine" as may be used herein will be appreciated as comprising various configurations of computer hardware and/or software implemented to perform operations. In some embodiments, modules or engines as described may be represented as instructions operable to be executed by a processor (e.g., a processing circuit) and a memory. In other embodiments, modules or engines as described may be represented as instructions read or executed from a computer readable media, which may be non-transitory computer readable. A module or engine may be generated according to application specific parameters or user settings. It will be appreciated by those of skill in the art that such configurations of hardware and software may vary, but remain operable in substantially similar ways.

While the present invention and associated inventive concepts have been illustrated by the description of various embodiments thereof, and while these embodiments have been described in considerable detail, it is not the intention of the Applicant to restrict or in any way limit the scope of the appended claims to such detail. Additional advantages and modifications will readily appear to those skilled in the art. Moreover, in some instances, elements described with one embodiment may be readily adapted for use with other embodiments. Therefore, the invention, in its broader aspects, is not limited to the specific details, the representative apparatus, and illustrative examples shown and described. Accordingly, departures may be made from such details without departing from the spirit or scope of the general inventive concepts.

The invention claimed is:

1. A method for determining a degradation of one or more components of a power electronic device via a diagnostic system embedded in an electromagnetic interface (EMI) filter, the method comprising the steps of:
    modeling a component of the power electronic device;
    modeling one or more failure modes for the component;
    identifying an electromagnetic interference (EMI) characteristic of the component, wherein the EMI characteristic is indicative of each of the one or more failure modes;
    training a machine learning algorithm to detect the one or more modeled failure modes based on the EMI characteristic;
    monitoring the EMI of the component;
    analyzing the monitored EMI via the machine learning algorithm to detect the one or more modeled failure modes; and
    providing feedback upon detecting the one or more modeled failure modes.

2. The method of claim 1, wherein the feedback is provided to a user via a user interface.

3. The method of claim 1, wherein the one or more failure modes includes one or more of an aging failure mode, an abuse failure mode, or a defect failure mode.

4. The method of claim 3, wherein the failure mode is an aging failure mode including aging characteristics of the component.

5. The method of claim 3, wherein the failure mode is an abuse failure mode including abusive characteristics of the component.

6. The method of claim 3, wherein the failure mode is a defective failure mode including defective characteristics of the component.

7. The method of claim 1, wherein the feedback provided to a user via a display or in audible.

8. A method of detecting circuit faults via a diagnostic system embedded in an electromagnetic interface (EMI) filter, the method comprising the steps of: identifying a component;
modeling a failure mode of the component;
measuring the electromagnetic frequency spectrum produced by the circuit when the component is experiencing a failure mode;
training a machine learning algorithm to detect the modeled failure mode using the measured electromagnetic frequency spectrum;
recording the electromagnetic frequency spectrum of the circuit;
analyzing the recorded electromagnetic frequency spectrum using the machine learning algorithm to detect a modeled failure mode of the component.

9. The method of claim 8, wherein the failure mode is based on an aging of the component.

10. The method of claim 8, wherein the failure mode is based on abuses to the component.

11. The method of claim 8, wherein the failure mode is based on a defect of the component.

12. A non-destructive testing system for power electronics:
an electromagnetic interference (EMI) filter having a frequency sensing element and a diagnostic system, wherein the diagnostic system includes:
a processing circuit operably connected to a memory having programmable instructions stored thereon, wherein the programmable instructions, when executed by the processing circuit, causes the diagnostic system to:
model a component of the power electronic device;
model a failure mode for the component;
identify an (EMI) characteristic of the component, wherein the EMI characteristic is indicative of the modeled failure mode;
train a detector via a machine learning algorithm to detect the modeled failure mode based on the EMI characteristic;
monitoring the EMI of the component;
analyzing the monitored EMI to detect the modeled failure mode;
indicate to a user that the component is less than optimal based on the detected modeled failure mode;
wherein the diagnostic system is embedded in the EMI filter.

13. The system of claim 12, wherein the embedded system uses signal conditioning to modify the signal for analog to digital conversion.

14. The system of claim 12, wherein the frequency sensing element is a high frequency sensing element.

15. The system of claim 12, wherein the frequency sensing element provides a propagation path for the spectral content of interest by enabling measurements of a time domain voltage and/or current signals.

16. The system of claim 12, wherein the frequency sensing element is shunt configured.

17. The system of claim 16, wherein the shunt configured frequency sensing element measures voltage across a burden resistor.

18. The system of claim 12, wherein the frequency sensing element is series configured.

19. The system of claim 18, wherein the series configured frequency sensing element measures current using a high frequency transformer.

20. The method of claim 8 further comprising:
indicating to a user that the component is less than optimal based on the detected modeled failure mode.

* * * * *